(12) United States Patent
Kim et al.

(10) Patent No.: US 11,609,601 B2
(45) Date of Patent: Mar. 21, 2023

(54) DISPLAY APPARATUS AND MANUFACTURING METHOD THEREOF

(71) Applicant: Samsung Display Co., Ltd., Yongin-Si (KR)

(72) Inventors: Jaeik Kim, Yongin-si (KR); Jaesik Kim, Yongin-si (KR); Yeonhwa Lee, Yongin-si (KR); Joongu Lee, Yongin-si (KR); Jiyoung Choung, Yongin-si (KR)

(73) Assignee: Samsung Display Co., Ltd.

(*) Notice: Subject to any disclaimer, the term of this patent is extended or adjusted under 35 U.S.C. 154(b) by 328 days.

(21) Appl. No.: 16/812,067

(22) Filed: Mar. 6, 2020

(65) Prior Publication Data

US 2020/0409412 A1    Dec. 31, 2020

(30) Foreign Application Priority Data

Jun. 28, 2019  (KR) .................. 10-2019-0078338

(51) Int. Cl.
*G06F 1/16* (2006.01)
*H01L 51/56* (2006.01)
(Continued)

(52) U.S. Cl.
CPC .......... *G06F 1/1609* (2013.01); *H01L 27/326* (2013.01); *H01L 51/56* (2013.01); *H01L 27/32* (2013.01); *H01L 27/3246* (2013.01); *H01L 27/3248* (2013.01); *H01L 27/3262* (2013.01); *H01L 51/5203* (2013.01); *H01L 51/5234* (2013.01); *H01L 2251/5346* (2013.01); *H01L 2251/55* (2013.01)

(58) Field of Classification Search
CPC ..... G06F 1/1609; H01L 27/326; H01L 51/56; H01L 51/5234; H01L 2251/5346; H01L 2251/55; H01L 27/3246; H01L 27/3248; H01L 27/3262; H01L 27/32; H01L 51/5203; H01L 2251/30
See application file for complete search history.

(56) References Cited

U.S. PATENT DOCUMENTS 8,796,702 B2   8/2014  Kim et al.
9,761,647 B2   9/2017  Lee et al.
(Continued)

FOREIGN PATENT DOCUMENTS

KR   10-2011-0103735 A   9/2011
KR   10-2012-0044876 A   5/2012
(Continued)

OTHER PUBLICATIONS

TWI Global, Typical Values of Surface Energy for Mateirals and Adhesives (accessed May 17, 2022), https://www.twi-global.com/technical-knowledge/faqs/faq-what-are-the-typical-values-of-surface-energy-for-materials-and-adhesives.*

*Primary Examiner* — Anthony J Frost
(74) *Attorney, Agent, or Firm* — Innovation Counsel LLP

(57) ABSTRACT

A display apparatus having high external light transmittance and a manufacturing method of the display apparatus are provided, wherein the display apparatus does not substantially include a common electrode in a transmission region. Particularly, a display apparatus includes a first substrate, a second substrate facing the first substrate, and a display unit interposed between the first substrate and the second substrate.

17 Claims, 17 Drawing Sheets

(51) Int. Cl.
H01L 27/32 (2006.01)
H01L 51/52 (2006.01)

(56) References Cited

U.S. PATENT DOCUMENTS

| | | |
|---|---|---|
| 10,403,699 B2 | 9/2019 | Chung et al. |
| 2017/0110521 A1* | 4/2017 | Park .................... H01L 51/5209 |
| 2017/0324065 A1* | 11/2017 | Lang .................... H01L 27/3202 |
| 2018/0090709 A1* | 3/2018 | Meng .................. H01L 51/0096 |
| 2018/0261656 A1 | 9/2018 | Kim et al. |

FOREIGN PATENT DOCUMENTS

| | | |
|---|---|---|
| KR | 10-2017-0129318 A | 11/2017 |
| KR | 10-2018-0104784 A | 9/2018 |

* cited by examiner

DISPLAY APPARATUS AND MANUFACTURING METHOD THEREOF

CROSS-REFERENCE TO RELATED APPLICATION

This application claims the benefit of Korean Patent Application No. 10-2019-0078338, filed on Jun. 28, 2019, in the Korean Intellectual Property Office, the disclosure of which is incorporated herein in its entirety by reference.

BACKGROUND

1. Field

One or more embodiments relate to a display apparatus, and more particularly, to a display apparatus having a transmission region and a manufacturing method thereof.

2. Description of Related Art

In recent years, the usage of display apparatuses has diversified. Also, as display apparatuses become thinner and lighter, the range of their use is widening.

As one example, research into the realization of transmissivity or transparency of display apparatuses is continuing. Specifically, there is an attempt to form transparent display apparatuses by making a thin-film transistor or display panel in display apparatuses have a transparent form.

In order to realize a transparent display apparatus, it is necessary to optimize various variables such as the composition, arrangement, and thickness of various components such as a substrate, an electrode, an insulating film, and a capping film. For example, in the case of organic light emitting display apparatuses, a plurality of conductive films and insulating films including different materials are stacked. Accordingly, optical properties may be deteriorated, and thus it may not be easy to obtain desired transmissivity or transparency.

SUMMARY

One or more embodiments provide a display apparatus having high external light transmittance and a manufacturing method thereof, wherein the display apparatus does not substantially include a common electrode in a transmission region.

Technical objects to be achieved by the present disclosure are not limited to the above-mentioned technical objects, and other technical objects not mentioned will be clearly understood by those skilled in the art from the description of the present disclosure.

Additional aspects will be set forth in part in the description which follows and, in part, will be apparent from the description, or may be learned by practice of the presented embodiments of the disclosure.

According to an embodiment, a display apparatus includes: a first substrate; and a display unit, wherein the display unit includes a display region and a transmission region, the display unit includes an auxiliary layer disposed to correspond to the transmission region, and a second electrode disposed to correspond only to the display region, the auxiliary layer includes a first material and a third material, the second electrode includes a second material, the first material and the second material satisfy Equation 1 below, the auxiliary layer includes a first region and a second region between the first region and the first substrate, and a concentration of the first material in the first region is different from a concentration of the first material in the second region:

$$ST2-ST1>0 \text{ mJ/m}^2 \qquad \text{<Equation 1>}$$

In Equation 1,

ST1 is surface energy of the first material at 25° C., and

ST2 is surface energy of the second material at 25° C.

In the embodiment, the second electrode may not be present in the transmission region.

In the embodiment, the first region may include a location having a maximum first material concentration.

In the embodiment, the auxiliary layer may further include a third region, the third region may be interposed between the second region and the first substrate, and a concentration of the first material in the second region may be different from a concentration of the first material in the third region.

In the embodiment, ST1 may be greater than about 0 mJ/m² and about 30 mJ/m² or less.

In the embodiment, the first material may have a molecular weight of about 1500 or less.

In the embodiment, the second material may include magnesium (Mg), silver (Ag), aluminum (Al), lithium (Li), calcium (Ca), indium (In), or a combination thereof.

In the embodiment, the third material may have a molecular weight of about 1500 or less.

According to another embodiment, a display apparatus includes: a first substrate; and a display unit, wherein the display unit includes a display region and a transmission region, the display unit includes an auxiliary layer disposed to correspond to the transmission region, and a second electrode disposed to correspond to the display region and the transmission region, the auxiliary layer includes a first material and a third material, the second electrode includes a second material, the first material and the second material satisfy Equation 1 below, the auxiliary layer includes a first region and a second region between the first region and the first substrate, and a concentration of the first material in the first region is different from a concentration of the first material in the second region:

$$ST2-ST1>0 \text{ mJ/m}^2 \qquad \text{<Equation 1>}$$

In Equation 1,

ST1 is surface energy of the first material at about 25° C., and

ST2 is surface energy of the second material at about 25° C.

In the embodiment, a first portion of the second electrode may be disposed to correspond to the display region, a second portion of the second electrode may be disposed to correspond to the transmission region, and a thickness $T_1$ of the first portion and a thickness $T_2$ of the second portion may satisfy Equation 1 below:

$$T_1>T_2. \qquad \text{<Equation 2>}$$

In the embodiment, T2 may be greater than about 0 nm and about 1 nm or less.

In the embodiment, the first region may include a location having a maximum first material concentration.

In the embodiment, the auxiliary layer may further include a third region, the third region may be interposed between the second region and the first substrate, and a concentration of the first material in the second region may be different from a concentration of the first material in the third region.

In the embodiment, ST1 may be greater than about 0 mJ/m$^2$ and about 30 mJ/m$^2$ or less.

In the embodiment, the first material may have a molecular weight of about 1500 or less.

In the embodiment, the second material may include magnesium (Mg), silver (Ag), aluminum (Al), lithium (Li), calcium (Ca), indium (In), or a combination thereof.

In the embodiment, the third material may have a molecular weight of about 1500 or less.

According to an embodiment, a method of manufacturing a display apparatus includes: providing a first substrate; and providing a display unit including a display region and a transmission region on the first substrate, wherein the providing the display unit includes:

providing a first material on the display region and the transmission region, providing a third material only on the transmission region, and then removing the first material on the display region to provide an auxiliary layer located to correspond to the transmission region; and providing a second electrode, the auxiliary layer includes a first material and a third material, the second electrode includes a second material, and the first material and the second material satisfy Equation 1 below:

$$ST2-ST1>0 \text{ mJ/m}^2 \qquad \text{<Equation 1>}$$

In Equation 1,

ST1 is surface energy of the first material at about 25° C., and

ST2 is surface energy of the second material at about 25° C.

In the embodiment, the third material may be provided by performing deposition using a fine metal mask.

In the embodiment, the second electrode may be provided by depositing the second material using an open mask.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
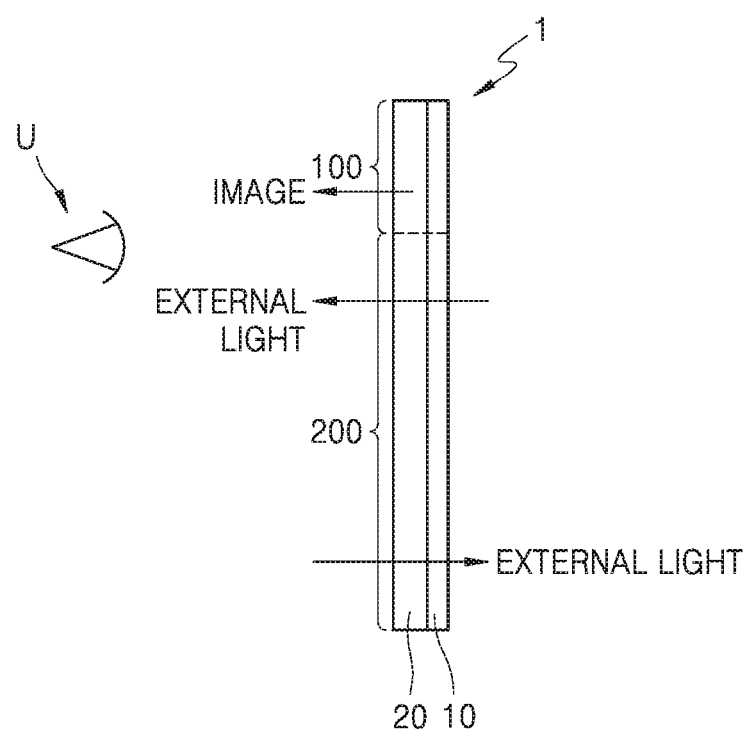
FIG. 1 is a structural view schematically illustrating a display apparatus according to an embodiment of the present disclosure.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

Hereinafter, embodiments of the present disclosure will be described in detail with reference to the accompanying drawings. Throughout the drawings, the same reference numerals will refer to the same or like parts, and redundant description thereof will be omitted.

In the following embodiments, although the terms "first," "second," etc. may be used herein to describe various elements, these elements should not be limited by these terms. These terms are only used to distinguish one element from another element.

In the following embodiments, the singular forms "a," "an" and "the" are intended to include the plural forms as well, unless the context clearly indicates otherwise.

In the following embodiments, the terms "comprise", "include", "have", etc. when used in this specification, specify the presence of stated features, integers, steps, operations, elements, components, and/or combinations of them but do not preclude the presence or addition of one or more other features, integers, steps, operations, elements, components, and/or combinations thereof.

In the following embodiments, when a layer, film, region, plate, or the like is referred to as being "on" or "on" another portion throughout the specification, this includes not only the case directly above another portion but also the case where there is another portion in between.

In the drawings, components may be exaggerated or reduced in size for convenience of explanation. For example, since the size and thickness of each component shown in the drawings are arbitrarily illustrated for convenience of explanation, the present disclosure is not necessarily limited thereto.

In the case where an embodiment may be implemented differently, a specific process order may be performed differently from the described order. For example, two processes described in succession may be performed substantially simultaneously or in an order opposite to the order described.

In the following embodiments, when a film, a region, an element, or the like is referred to as being "coupled" or "connected" to another film, another region, another element, or the like, it can be directly coupled or connected to another film, another region, another element, or the like or intervening another film, another region, another element, or the like may be present therebetween. For example, as used herein, when a film, a region, an element, or the like is referred to as being "electrically coupled" or "electrically connected" to another film, another region, another element, or the like, it can be directly electrically coupled or connected to another film, another region, another element, or the like or intervening another film, another region, another element, or the like may be present therebetween.

FIG. 1 is a structural view schematically illustrating a display apparatus according to an embodiment of the present disclosure Referring to FIG. 1, a display apparatus 1 according to an embodiment includes a first substrate 10, a display unit 20. The display unit 20 may include a display region 100 in which an image is implemented and a transmission region 200 through which external light is transmitted. In the display apparatus 1, external light is incident through the first substrate 10 and the display unit 20.

In the display apparatus 1, an image is implemented through the display region 100, and external light is transmitted through the transmission region 100. A user U may see an external image through the transmission region 200. That is, the display apparatus 1 may be implemented as a display in which the transmittance of the display region 100 and the transmittance of the transmission region 200 are different from each other.

In an embodiment, a front emission type display apparatus, by which the user U located at side where an image is realized can observe the image of the outer side of the first substrate 10, is described as an example, but the display apparatus of the present disclosure is not limited thereto. In another embodiment, a back emission type display apparatus in which an image is realized in a direction from the display unit 20 toward the first substrate 10 may be used.

Since a thin film transistor, a capacitor, and the like are not disposed in the transmission region 100, the transmittance of external light in the transmission region 100 may be increased to increase the external light transmittance of the display apparatus, and it is possible to prevent a transmission image from being disturbed by interference with the thin film transistor, the capacitor, and the like.

The display device 1 may further include a second substrate 30 facing the first substrate 10. In this case, the display unit 20 may be interposed between the first substrate 10 and the second substrate 30.

The second substrate 30 is made of transparent glass or plastic to realize an image from the display unit 20, and prevents external air and moisture from permeating into the display unit 20. Edges of the first substrate 10 and the second substrate 30 may be attached to each other by a sealing material to seal a space between the first substrate 10 and the second substrate 30. An absorbent, a filler, or the like may be disposed in space. Alternatively, the space may be sealed by forming the second substrate 30, which is a thin film, on the first substrate 10 and the display unit 20. In this case, both the first substrate 10 and the second substrate 30 may be flexible.

Hereinafter, an organic light emitting display apparatus will be described as an example of the display apparatus 1 according to an embodiment of the present disclosure. However, the display apparatus of the present disclosure is not limited thereto. In another embodiment, various display apparatuses such as an inorganic light emitting display apparatuses and a quantum dot light emitting display apparatuses may be used.

Figure 2:
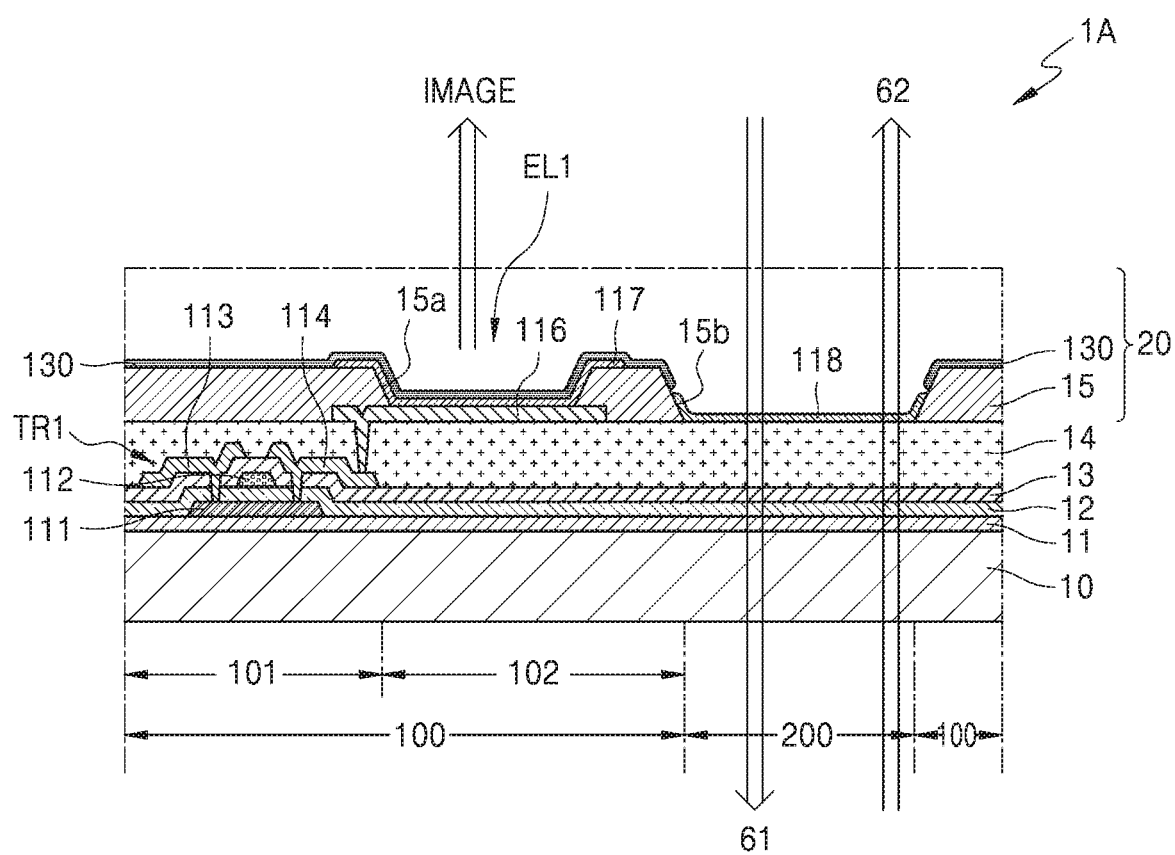
FIG. 2 is a cross-sectional view schematically illustrating a display apparatus according to an embodiment of the present disclosure.
Figure 3:
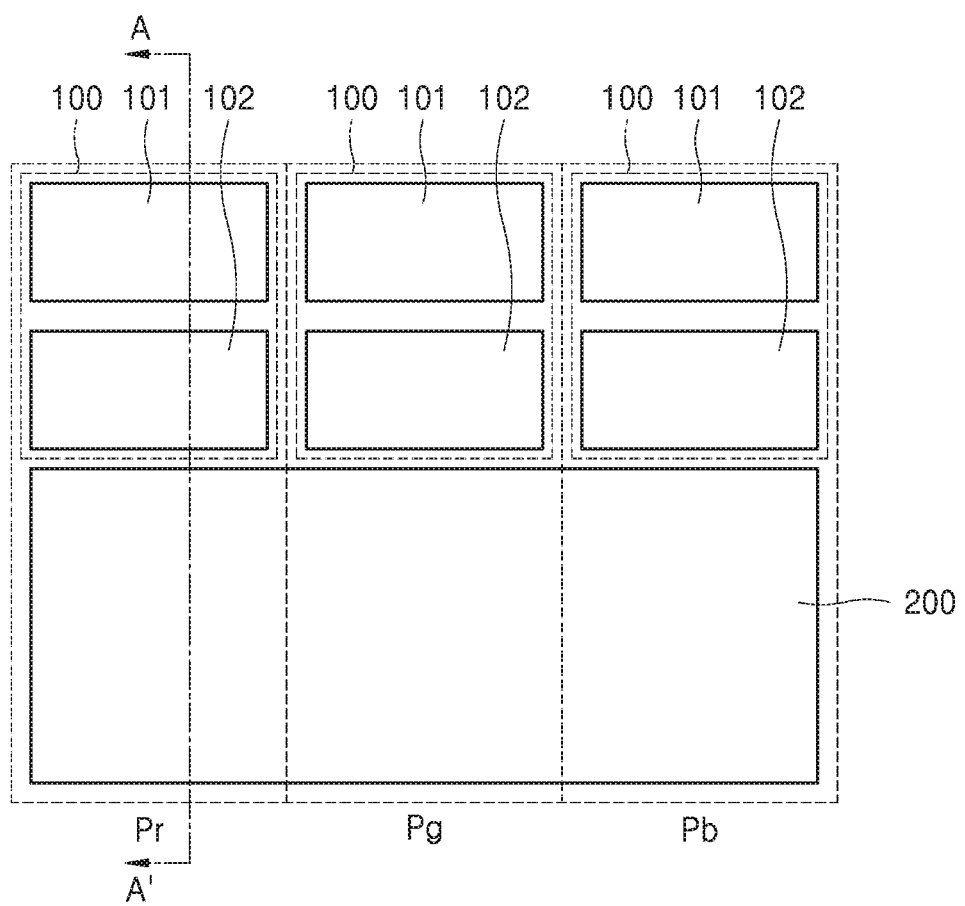
FIG. 3 is a plan view schematically illustrating a display apparatus according to an embodiment of the present disclosure.

FIG. 2 is a cross-sectional view schematically illustrating a display apparatus according to an embodiment of the present disclosure, and FIG. 3 is a plan view schematically illustrating a display apparatus according to an embodiment of the present disclosure. Specifically, FIG. 3 is a plan view illustrating first pixels PX1 adjacent to each other, for example, a first red pixel Pr, a first green pixel Pg, and a first blue pixel Pb, and FIG. 2 is a cross-sectional view taken along the line A-A' of FIG. 3.

Referring to FIG. 2, the display unit 20 may include a display region 100 in which an image is displayed and a transmission region 200 which is adjacent to the display region 100 and through which external light is transmitted. Here, the external light is external light distinguished from the light emitted by the light emitting element EL1 of the first pixel PX1. The external light may be ambient light or light emitted by another electronic device.

In the transmission region 200, an element including an opaque material may not be disposed, and only a substantially transparent auxiliary layer, an insulating film, or the like may be disposed, and an image outside the display apparatus 1A may be transmitted directly.

First external light 61 and second external light 62 may transmit through the transmission region 200. The first external light 61 is external light transmitted from the outside of the display unit 20 to the outside of the first substrate 10. The second external light 62 is external light transmitted from the outside of the first substrate 10 to the outside of the display unit 20. Elements and wirings may be arranged to bypass the transmission region 200, and thus devices and wirings may not be disposed in the transmission region 200. At least a fourth insulating film 15 may not be provided in the transmission region 200. The insulating film 14 disposed in the transmission region 200 may include a transparent insulating material.

The display region 100 may include a light emitting area 102 and a circuit area 101. The first pixel PX1 may be disposed in the display region 100. The light emitting element EL1 of the first pixel PX1 may be disposed in the light emitting area 102. A pixel circuit of the first pixel PX1 electrically connected to the light emitting device EL1 and including the thin film transistor TR1 may be disposed in the circuit area 101. The circuit area 101 and the light emitting area 102 do not overlap each other, and thus the light emitting element EL1 and the pixel circuit may be disposed adjacent to each other so as not to overlap each other. One thin film transistor TR1 is disposed in the circuit area 101 as shown in the drawings, but the present disclosure is not limited thereto. The circuit area 101 may include a plurality of thin film transistors and a plurality of capacitors, and may further include scanning lines, data lines, and power supply lines, which area connected to the plurality of thin film transistors and the plurality of capacitors.

The thin film transistor TR1 may include a semiconductor layer 111, a gate electrode 112, a source electrode 113, and a drain electrode 114 on the buffer film 11. The first insulating film 12 between the semiconductor layer 111 and the gate electrode 112 may function as a gate insulating film, and the second insulating film 13 between the gate electrode 112 and the drain electrode 114 and between the source electrode 113 and the drain electrode 114 may function as an interlayer insulating film.

The light emitting element EL1 may include a first electrode 116 on the third insulating film 14 covering the thin film transistor TR1, a second electrode 130 facing the first electrode 116, and an intermediate layer 117 between the first electrode 116 and the second electrode 130.

An edge of the first electrode 116 may be covered by the fourth insulating film 15, and a center portion of the first electrode 116 may be exposed. The fourth insulating film 15 may be provided to cover the display region 100. However, the fourth insulating film 15 is not necessarily provided to cover the entire display region 100, and is sufficient to cover at least part of the display region 100, particularly, the edge of the first electrode 116.

An auxiliary layer 118 is provided on the third insulating film 14 to correspond to the transmission region 200 exposed through the fourth insulating film 15. That is, the auxiliary layer 118 may be disposed not to overlap the intermediate layer 117.

The thickness of the auxiliary layer 118 may be about 1 nm to about 2,000 nm. Specifically, the thickness of the auxiliary layer 118 may be about 1 nm to about 50 nm, but is not limited thereto. When the thickness thereof satisfies the above range, as will be described later, it is possible to sufficiently obtain an effect of patterning the second electrode and to secure relatively high transmittance of the transmission region 200.

The auxiliary layer 118 includes a first material and a third material.

The second electrode 130 is provided on the intermediate layer 117. The second electrode 130 may be disposed only in the display region 100, and may not be disposed in the transmission region 200.

The second electrode 130 includes a second material.

The first material and the second material satisfy the following Equation 1:

$$ST2-ST1>0 \text{ mJ/m}^2 \qquad \text{<Equation 1>}$$

in Equation 1,

ST1 is surface energy of the first material at about 25° C., and

ST2 is surface energy of the second material at about 25° C.

The first material is provided to the entire surface (that is, both the display region 100 and the transmission region 200 using a dry process and/or a wet process, thereby forming a first layer. Specifically, in the case of a drying process, the first material may be deposited on the entire surface using an open mask, and in the case of a wetting process, the material may be applied onto the entire surface by coating.

Then, the third material is deposited only to correspond to the transmission region 200 using a fine metal mask, thereby forming a second layer.

Then, the first material provided to correspond to the display region 100 may be removed. Specifically, the first material exposed on the surface may be removed by performing a plasma treatment, for example, a plasma heat treatment on the entire surface, thereby forming an auxiliary layer 118. Since the third material is deposed to correspond to the transmission region 200, the transmission region 200 remains in a state in which the first material and the third material are not removed, even when plasma treatment is performed. During the process, the first material diffuses in a direction from the first layer to the second layer, and thus the interface between the first layer and the second layer disappears. Simultaneously, the concentration of the first material on one surface of the auxiliary layer 118, specifically, the concentration of the first material on a surface farther from the first substrate 10 increases.

Then, the second material is deposited on both the display region 100 and the transmission region 200 using an open mask. In this case, since the surface energy of the first material and the second material is controlled differently, the second material may be controlled such that the second material is not substantially disposed in an area where the first material is disposed. That is, the second material is relatively well deposited on the intermediate layer 117, but is not relatively well deposited on the auxiliary layer 118 including the first material. Accordingly, since the auxiliary layer 118 including the first material is disposed to correspond to the transmission region 200, the second electrode 130 including the second material may be disposed to correspond only to the display region 100 without being substantially provided to the transmission region 200.

As shown in FIGS. 2 and 3, the auxiliary layer 118 is disposed in an area where the second electrode 130 should not be disposed, and the auxiliary layer 118 is not disposed in an area where the second electrode 130 should be disposed. Then, during the process of depositing the second material, even when the second material is deposited on both the display region 100 and the transmission region 200 of all the pixels using an open mask, the metal is substantially deposited only on the surface of the exposed intermediate layer 117 and is not substantially deposited on the surface of the auxiliary layer 118, so that an effect of patterning the second electrode 130 is obtained.

The second electrode 130 should not be substantially disposed in the transmission region 200 in order to reduce the transmittance of the transmission region 200. For this purpose, when a fine metal mask is used to form the second electrode 130 disposed only in the display region 100, the fine metal mask may be deformed over a long period of use because deposition temperature is very high. This may result in a process that is very unstable, for example, a problem such as shadow phenomenon. However, the display apparatus 1 according to the embodiment of the present disclosure may automatically obtain an effect of patterning the second electrode 130 as described above, which may be advantageous in the process.

In addition, since the second electrode 130 is not substantially disposed in the transmission region 200, the transmittance of the transmission region 200 may be improved. In other words, the second electrode may be disposed to correspond only to the display region 100, and the second electrode 130 is not present in the transmission region 200, thereby improving the transmittance of the transmission region 200.

In an embodiment, the auxiliary layer 118 may include a first region and a second region. The second region may be interposed between the first region and the first substrate 10. That is, the second region and the first region may be sequentially disposed along a direction from the first substrate 10 to the display unit 20.

The concentration of the first material in the first region may be different from the concentration of the first material in the second region. Specifically, the concentration of the first material in the first region may be higher than the concentration of the first material in the second region. More specifically, the first region may include the maximum concentration position of the first material.

In another embodiment, the auxiliary layer 118 may further include a third region. The third region may be interposed between the second region and the first substrate 10. That is, the third region, the second region, and the first region may be sequentially disposed along a direction from the first substrate 10 to the display unit 20.

The concentration of the first material in the second region may be different from the concentration of the first material in the third region. Specifically, the concentration of the first material in the second region may be lower than each of the concentration of the first material in the first region and the concentration of the first material in the third region. More specifically, the concentration of the first material may gradually decrease from one surface of the auxiliary layer 118 toward the other surface thereof facing the one surface thereof, and then may gradually increase. However, the present disclosure is not limited thereto.

The first material is provided to form the first layer, and then the third material is provided on the top of the first layer to form the second layer, thereby forming the auxiliary layer 118. Immediately after the auxiliary layer 118 is formed, an interface between the first layer and the second layer may exist. However, as time passes, the first material diffuses in a direction of the first layer to the second layer, and thus the interface between the first layer and the second layer disappears. Finally, the auxiliary layer 118 shows a state in which the first material and the second material are mixed uniformly or ununiformly. Thus, as described above, a concentration profile of the first material is shown.

In an embodiment, ST2−ST1 may be about 30 mJ/m$^2$ or more, specifically, may be at least about 50 mJ/m$^2$ or more. When the above range is satisfied, the second material may not be substantially deposited on the first material.

Specifically, ST1 may be greater than about 0 mJ/m$^2$ and about 30 mJ/m$^2$ or less. When the above range is satisfied, the second material may not be substantially deposited on the first material. Specifically, ST1 may be about 20 mJ/m$^2$ or less, but is not limited thereto.

In an embodiment, the first material may include an organic compound. Specifically, the first material may include a fluorine-containing organic compound. More specifically, the first material may be an organic compound having relatively high fluorine content.

For example, the first material may contain about 20 at % or more of fluorine. When the above range is satisfied, the surface energy of the first material may be lowered to such a degree that the second material may not be substantially deposited on the first material. The fluorine content of the first material may be obtained by analyzing the first material using X-ray photoelectron spectroscopy (XPS). Specifically, the first material may contain about 50 at % or more of fluorine, but is not limited thereto.

For example, the first material may include an organic compound, as described above. The first material may include a fluorine-containing silane compound, a fluorine-based polymer compound, or any combination thereof.

The fluorine-containing silane compound may include, but is not limited to, trichloro(1H,1H,2H,2H-perfluoro-decyl)silane, trichloro(1H,1H,2H,2H-perfluoro-n-octyl)silane, triethoxy-1H,1H,2H,2H-perfluorodecylsilane, 1H,1H,2H,2H-nonafluorohexyltriethoxysilane, 1H, 1H,2H,2H-tridecafluoro-n-octyltriethoxysilane, 1H,1H,2H,2H-heptadecafluorodecyltrimethoxysilane, 1H,1H,2H,2H-nonafluorohexyltrimethoxysilane, trimethoxy(1H,1H,2H,2H-perfluoro-n-octyl)silane, 1,1,1-trifluoro-3-(trimethoxysilyl)propane, triethylsilyl)trifluoromethane, triethoxy[5,5,6,6,7,7,7-heptafluoro-4,4-bis(trifluoromethyl)heptyl]silane, trichloro(3,3,3-trifluoropropyl)silane, dimethoxy(methyl)(3,3,3-trifluoropropyl)silane, and dichloro(methyl)(3,3,3-trifluoropropyl)silane.

The fluorine-based polymer compound may include, but is not limited to, poly(hexafluoropropyleneoxide), poly(tetrafluoroethylene-co-hexafluoropropylene, poly(decafluorooctyl acrylate), poly(tetrafluoro-3-(heptafluoropropoxy)propyl acrylate, poly(tetrafluoro-3-(heptafluoroethoxy)propyl acrylate, poly(tetrafluoroehtylene), tetrafluoroethylene hexafluoropropylene vinylidene fluoride, poly(undecafluorohexyl acrylate), poly(nonafluoropentyl acrylate), poly(tetrafluoro-3-(trifluoromethoxy)propyl acrylate, poly(pentafluorovinyl propionate, poly(heptafluorobutyl acrylate), poly(trifluorovinyl acetate), poly(1,1,1,3,3,3-hexafluoroisopropyl acrylate, poly(octafluoropentyl acrylate), poly(methyl 3,3,3-trifluoropropyl siloxane, poly(2,2,3,3,4,4,4-heptafluorobutyl methacrylate), poly(pentafluoropropyl acrylate, poly(2,2,3,3,3-pentafluoropropyl acrylate), poly(2-heptafluorobutoxy)ethyl acrylate, poly(chlorotrifluoroethylene), and poly(1,1,1,3,3,3-hexafluoroisopropyl methaacrylate.

More specifically, the molecular weight of the first material may be about 1500 or less, but is not limited thereto.

As the difference between ST2 and ST1 increases, it is possible to prevent the second material from being substantially deposited on the first material. For this purpose, ST2 may be greater than about 30 mJ/m$^2$. Alternatively, ST2 may be about 100 mJ/m$^2$ or more, but is not limited thereto.

In an embodiment, the second material may include an inorganic compound. Specifically, the second material may include a metal-containing inorganic compound.

For example, the second material may include magnesium (Mg), silver (Ag), aluminum (Al), lithium (Li), calcium (Ca), indium (In), or any combination thereof. Specifically, the second material may include Mg, Ag, Al, or any combination thereof.

In an embodiment, the third material may have a molecular weight of about 1500 or less, the third material may include an organic compound.

For example, the third material may be selected from organic compounds used to form various functional layers included in the intermediate layer 117, but is not limited thereto.

Specifically, the third material may include a compound generally used in a hole transport layer or a hole injection layer. For example, the third material may include an aromatic amine compounds or a conductive polymer compounds.

More specifically, the third material may include, but is not limited to, m-MTDATA, TDATA, 2-TNATA, NPB (NPD), β-NPB, TPD, spiro-TPD, spiro-NPB, methylated-NPB, TAPC, HMTPD, TCTA (4,4',4''-tris(N-carbazolyl)triphenylamine, PANI/DBSA (polyaniline/Dodecylbenzenesulfonic acid, PEDOT/PSS (poly(3,4-ethylenedioxythiophene)/poly(4-styrenesulfonate), PEDOT/PSS/PFI (poly(3,4-ethylenedioxythiophene/poly(4-styrenesulfonate)/perfluorinated ionomer), PANI/CSA (polyaniline/camphor sulfonic acid, and PANI/PSS (Polyaniline/Poly(4-styrene-sulfonate), and combinations thereof.
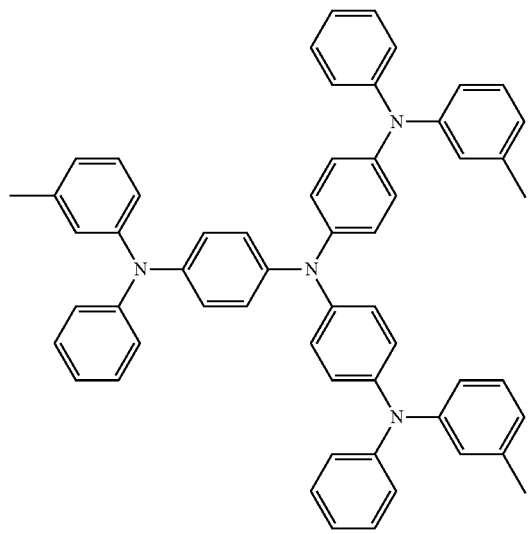
m-MTDATA
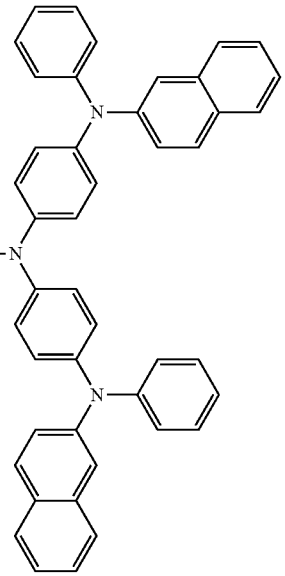
2-TNATA
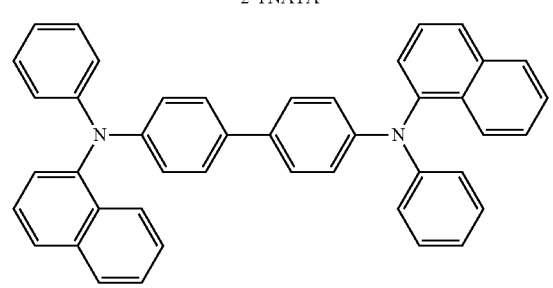
NPB
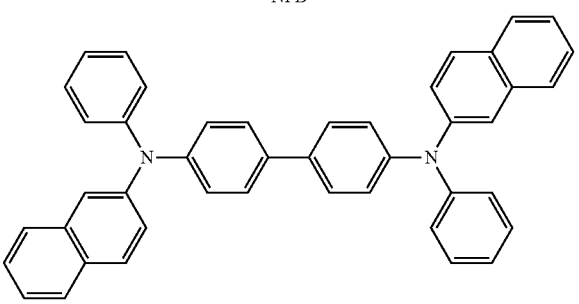
β-NPB
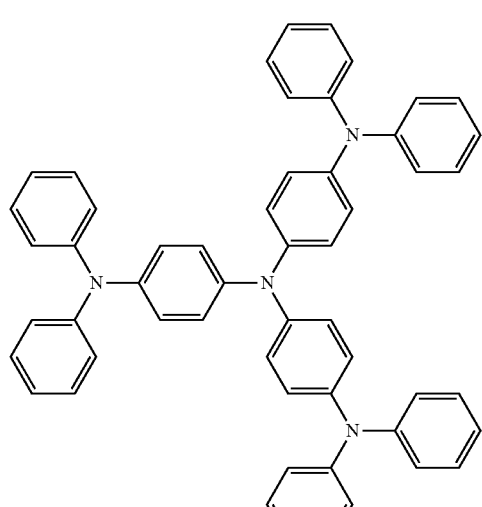
TDATA
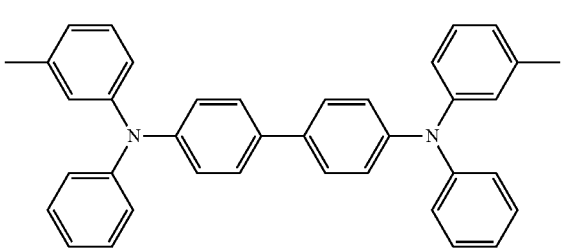
TPD

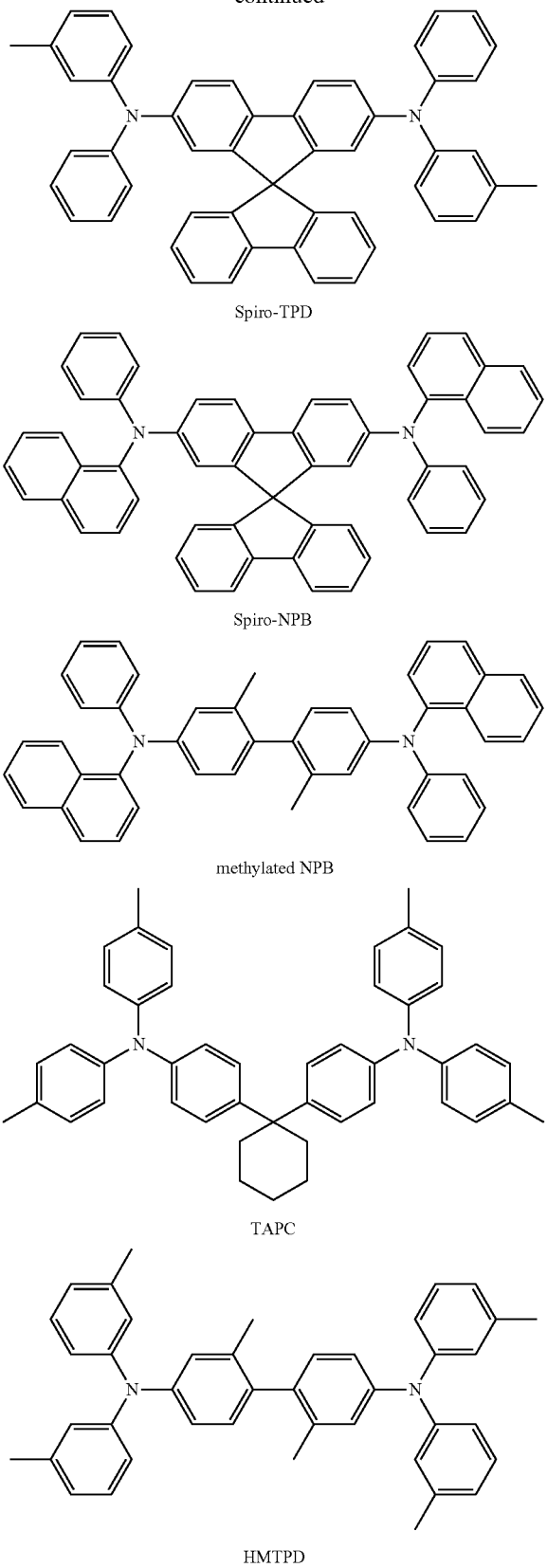

Spiro-TPD

Spiro-NPB methylated NPB

TAPC

HMTPD

The first pixel PX1 may be, for example, a first red pixel Pr, a first green pixel Pg, and a first blue pixel Pb. However, the present disclosure is not limited thereto, and any color combination may be used as long as white light can be realized by combining.

Figure 4:
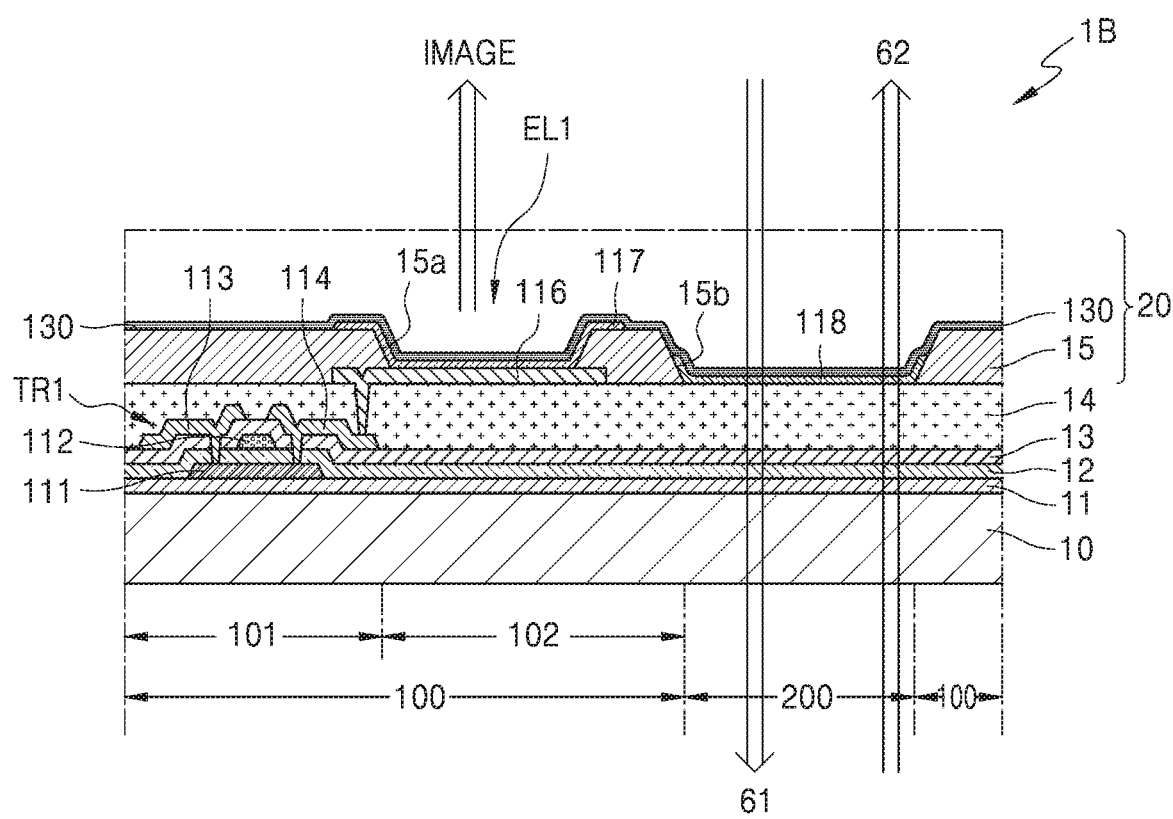
FIG. 4 is a cross-sectional view schematically illustrating a display apparatus according to another embodiment of the display apparatus of FIG. 2.
Figure 5:
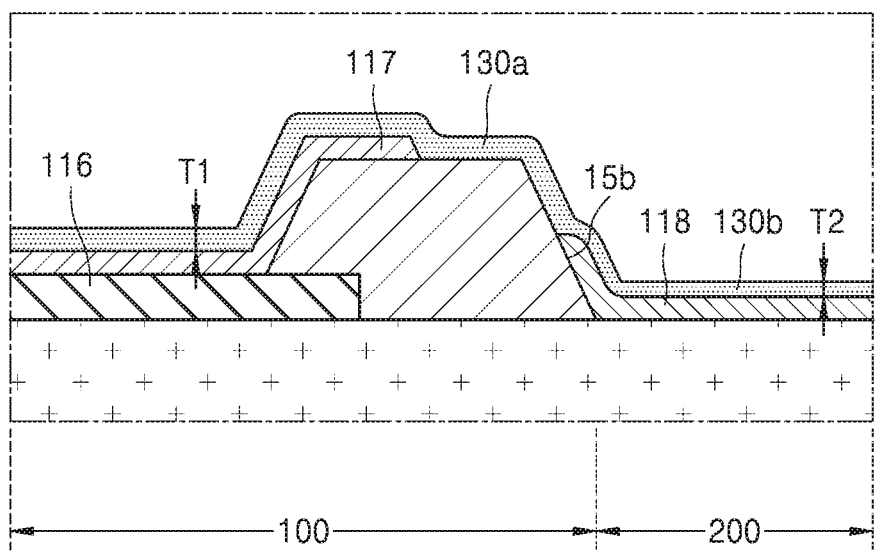
FIG. 5 is a cross-sectional view more specifically illustrating the display unit of FIG. 4.

FIG. 4 is a cross-sectional view schematically illustrating another embodiment of the display apparatus of FIG. 2. FIG. 5 is a cross-sectional view more specifically illustrating the display unit of FIG. 4.

As described above, the auxiliary layer 118 may be disposed only in the transmission region 200. In contrast, unlike that shown in FIG. 2, the second electrode 103 may be disposed to correspond to both the display region 100 and the transmission region 200.

When the second material is deposited by an open mask, as shown in FIG. 5, a first portion 130a of the second electrode 130 is disposed on the intermediate layer 117 to correspond to the display region 100, and a second portion 130b of the second electrode 130 is disposed on the auxiliary layer 118 to correspond to the transmission region 200. The thickness T1 of the first portion 130a and the thickness T2 of the second portion 130b satisfy Equation 2 below:

$$T_1 > T_2. \qquad \text{<Equation 2>}$$

Since Equation 2 above is satisfied, it is possible to reduce a decrease in transmittance due to the second portion 130b.

Here, $T_1$ refers to an average value of the thicknesses of the second electrodes in all the first portions, and $T_2$ refers to an average value of the thicknesses of the second electrodes in all the second portions. Here, the region where the second material is deposited by the open mask is composed of the sum of all the first portions and all the second portions.

However, the aforementioned content does not exclude a case where the second electrode agglomerates in a part of the transmission region 200 to form a film, and the second electrode may be formed into a film in an island shape in the transmission region 200.

Specifically, $T_2$ may be greater than about 0 nm and about 1 nm or less. More specifically, $T_2$ may be greater than about 0 nm and about 0.1 nm or less. When the above range is satisfied, the second electrode 130 is not substantially disposed in the transmission region 200.

Since each component has the same function as or similar function to the corresponding component of the aforementioned embodiment of FIGS. 2 and 3, a detailed description thereof will be omitted.

Figure 6:
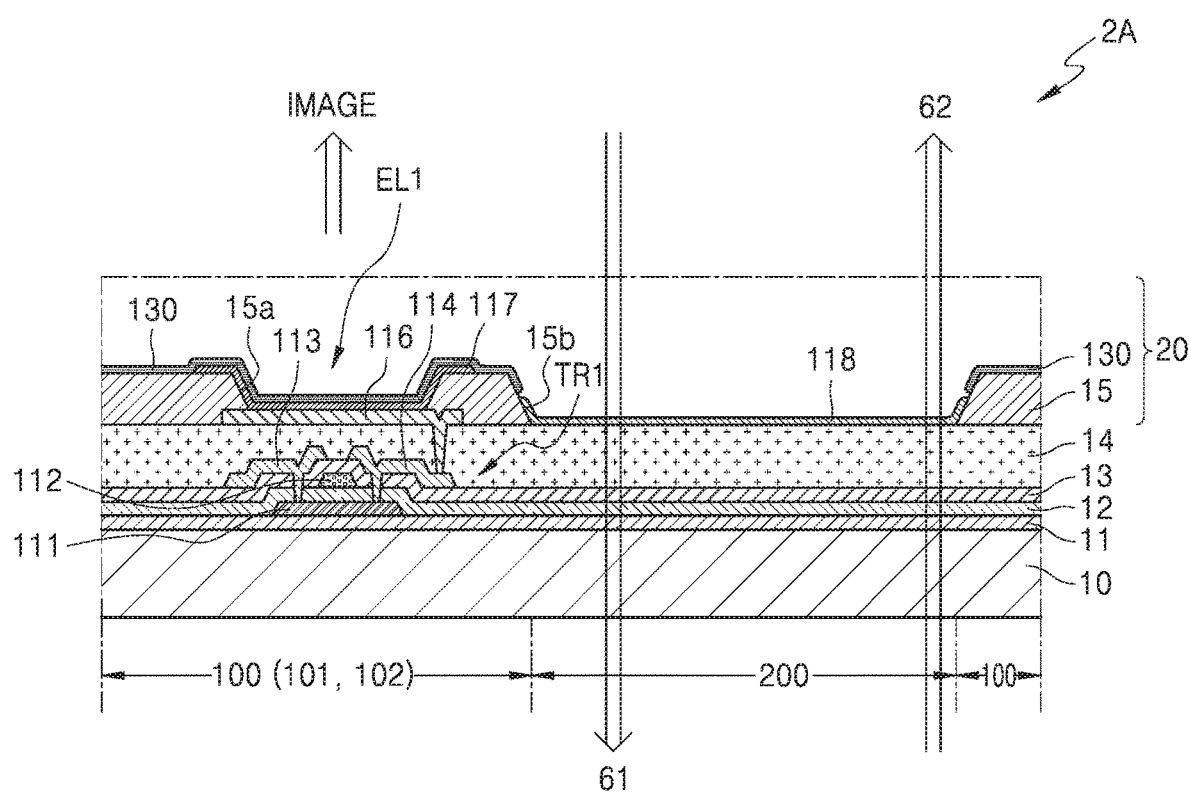
FIG. 6 is a cross-sectional view schematically illustrating a display apparatus according to another embodiment of the present disclosure.
Figure 7:
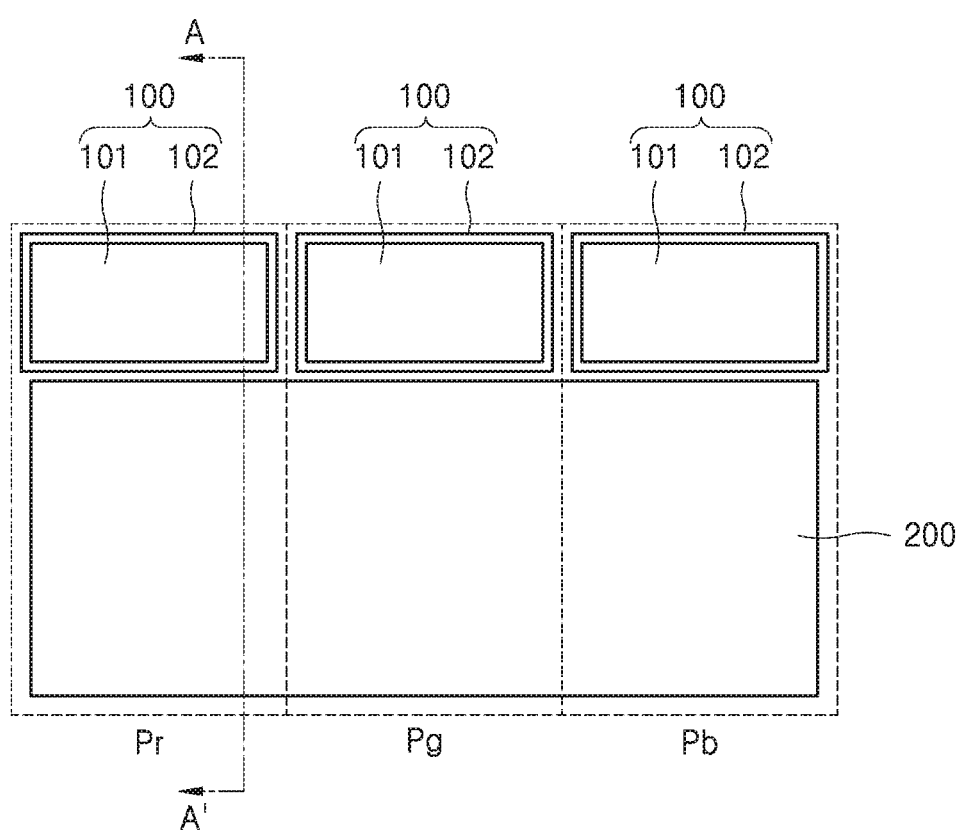
FIG. 7 is a plan view schematically illustrating a display apparatus according to another embodiment of the present disclosure.

FIG. 6 is a cross-sectional view schematically illustrating a display apparatus 2A according to another embodiment of the present disclosure, and FIG. 7 is a plan view schematically illustrating a display apparatus 2A according to another embodiment of the present disclosure. Specifically, FIG. 7 is a plan view illustrating first pixels PX1 adjacent to each other, for example, a first red pixel Pr, a first green pixel Pg, and a first blue pixel Pb. FIG. 6 is a cross-sectional view taken along the line A-A' of FIG. 7.

Unlike the display apparatus 1A shown in FIGS. 2 and 3, the display apparatus 2A shown in FIGS. 6 and 7 may be disposed so that the circuit area 101 and light emitting area 102 included in the display region 100 overlaps each other.

The transmission regions 200 adjacent to the plurality of first pixels PX1, for example, the first red pixel Pr, the first green pixel Pg, and the blue pixel Pb may be connected to each other to form a common transmission region 200. In this case, the area of the transmission region 200 may be larger than that of the embodiment of FIGS. 2 and 3. Thus, the transmittance of the display apparatus 2A may be increased.

Figure 8:
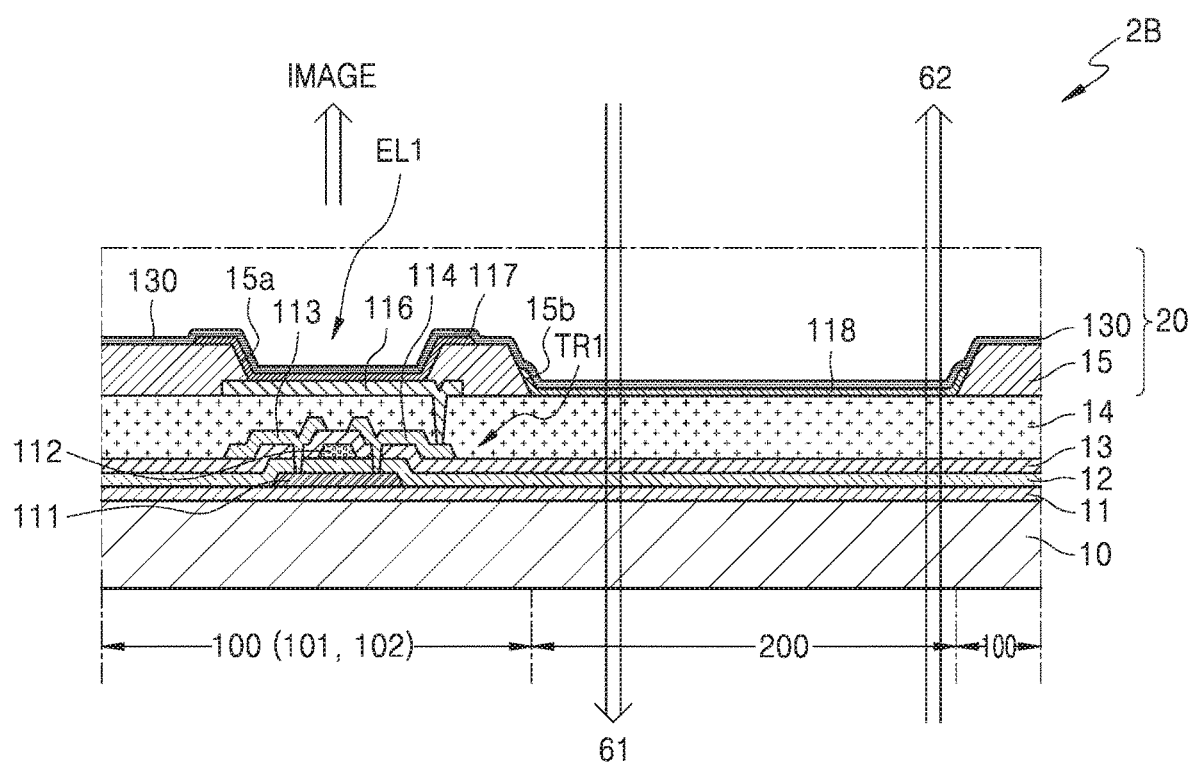
FIG. 8 is a cross-sectional view schematically illustrating a display apparatus according to another embodiment of the display apparatus of FIG. 6.

Since each component has the same function as or similar function to the corresponding component of the aforementioned embodiment of FIGS. 2 and 3, a detailed description thereof will be omitted FIG. 8 is a cross-sectional view schematically illustrating a display apparatus 2B according to another embodiment of the display apparatus of FIG. 6.

As described above, the auxiliary layer 118 may be disposed only in the transmission region 200. In contrast, unlike that shown in FIG. 6, the second electrode 103 may be disposed to correspond to both the display region 100 and the transmission region 200.

When the second material is deposited by an open mask, a first portion 130a of the second electrode 130 is disposed on the intermediate layer 117 to correspond to the display region 100, and a second portion 130b of the second electrode 130 is disposed on the auxiliary layer 118 to correspond to the transmission region 200. The thickness of the first portion 130a is represented by a first thickness $T_1$, the thickness of the second portion 130b is represented by a second thickness $T_2$, and the second thickness $T_2$ and the first thickness $T_1$ satisfy Equation 2 below:

$$T_1 > T_2. \qquad \text{<Equation 2>}$$

in Equation 2 above,

T1 is a thickness of the second electrode in the display region, and

T2 is a thickness of the second electrode in the transmission region.

Since Equation 2 above is satisfied, it is possible to reduce a decrease in transmittance due to the second portion 130b.

Specifically, $T_2$ may be greater than about 0 nm and 1 nm or less. More specifically, $T_2$ may be greater than about 0 nm and 0.1 nm or less. When the above range is satisfied, the second electrode 130 is not substantially disposed in the transmission region 200.

Since each component has the same or similar function as the corresponding component of the aforementioned embodiment of FIGS. 2 to 4, a detailed description thereof will be omitted.

FIGS. 9 to 16 are cross-sectional views illustrating a method of manufacturing a display apparatus according to an embodiment.

Referring to FIGS. 9 to 16, a method of manufacturing the display apparatus 1A according to an embodiment includes: providing a first substrate; and providing a display unit including a display region and a transmission region on the first substrate, wherein the providing the display unit includes: providing a first material on the display region and the transmission region, providing a third material only on the transmission region, and then removing the first material on the display region to provide an auxiliary layer disposed to correspond to the transmission region; and providing a second electrode, the auxiliary layer includes a first material and a third material, and the second electrode includes a second material. The description of the first material and the second material refers to the aforementioned description.

Hereinafter, a method of manufacturing the display apparatus 1A according to an embodiment of the present disclosure will be described in detail with reference to the drawings.

Figure 9:
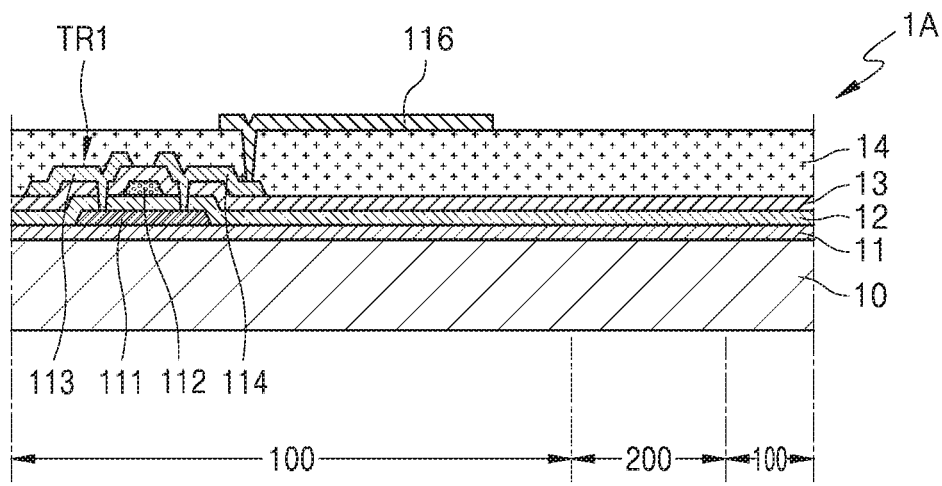
FIGS. 9 to 16 are cross-sectional views illustrating a method of manufacturing a display apparatus according to an embodiment.

Referring to FIG. 9, a buffer film 11 is provided on a first substrate 10, and a pixel circuit including a thin film transistor TR1 is provided on the buffer film 11.

The first substrate 10 may include a glass material, a ceramic material, a metal material, a plastic material, or a material having flexible or bendable properties.

The buffer film 11 may function to block the infiltration of impurity elements through the first substrate 10 and planarize the surface thereof, and may be formed of a single layer or a plurality of layers of an inorganic material such as silicon nitride ($SiN_x$) and/or silicon oxide ($SiO_x$). The buffer film 11 may be omitted.

A semiconductor layer 111 of the first pixel PX1 of the display apparatus 1A is provided on the buffer film 11. The semiconductor layer 111 may contain various materials. For example, the semiconductor layer 111 may contain an inorganic semiconductor material such as amorphous silicon or crystalline silicon. As another example, the semiconductor layer 111 may contain an oxide semiconductor or an organic semiconductor material.

A first insulating film 12 may be provided on the buffer film 11 to cover the semiconductor layer 111, and a gate electrode 112 of the first pixel PX1 may be provided on the first insulating film 12.

The first insulating film 12 may be formed of a single layer or a plurality of layer including at least one selected from $SiO_2$, $SiN_x$, SiON, $Al_2O_3$, $TiO_2$, $Ta_2O_5$, $HfO_2$, $ZrO_2$, BST, and PZT. The first insulating film 12 may be an inorganic insulating film.

The gate electrode 112 may be formed of various conductive materials. For example, the gate electrode 112 may be formed of a single layer or a plurality of layers including at least one selected from aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu). For example, the gate electrode 112 may be formed of three layers of Mo/Al/Mo or Ti/Al/Ti.

A second insulating film 13 may be provided on the first insulating film 12 to cover the gate electrode 112, and a source electrode 113 and a drain electrode 114 of the first pixel PX1 may be provided on the second insulating film 13 to be electrically connected to the semiconductor layer through a contact hole, respectively.

The second insulating film 13 may be an inorganic insulating film. The second insulating film 13 may be formed of a single layer or a plurality of layer including at least one selected from $SiO_2$, $SiN_x$, SiON, $Al_2O_3$, $TiO_2$, $Ta_2O_5$, $HfO_2$, $ZrO_2$, BST, and PZT. In another embodiment, the second insulating film 13 may be an organic insulating film.

Each of the source electrode 113 and the drain electrode 114 may be formed of various conductive materials. For example, each of the source electrode 113 and the drain electrode 114 may be formed of a single layer or a plurality of layers including at least one selected from aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu). For example, each of the source electrode 113 and the drain electrode 114 may be formed of two or more layers.

The structure of the thin film transistor TR1 is not necessarily limited to that shown in the drawings, and various structures of the thin film transistor TR1 may be applied.

A third insulating film 14 is provided to cover the thin film transistor TR1 of the first pixel PX1.

The third insulating film 14 may be an organic film formed of a single layer or a plurality of organic insulating layers having a flat upper surface. The third insulating film 14 may include a general-purpose polymer (PMMA or PS), a polymer derivative having a phenol group, an acrylic polymer, an Imide-based polymer, an aryl ether-based polymer, an amide-based polymer, a fluorine-based polymer, a p-xylene-based polymer, a vinyl alcohol-based polymer, or a blend thereof. For example, the third insulating film 14 may include polyimides, polyamides, or acrylic resin.

In general, the surface energy of the compound included in the third insulating film 14 is 100 mJ/m$^2$ or more. Accordingly, when the second material is deposited directly on both the display region 100 and the transmission region 200 of the third insulating film 14 using an open mask without forming the auxiliary layer 118 in the transmission region 200, an effect of patterning the second electrode 130 may not be obtained at all because the surface energy of the compound included in the third insulating film 14 is the same as or similar to the surface energy of the second material.

A first electrode 116 of a light emitting element EL1 electrically connected to the thin film transistor TR1 of the first pixel PX1 is provided on the third insulating film 14. The first electrode 116 may be provided to correspond to the display region 100.

When the light emitting element EL1 is a front light emitting element, the first electrode 116 may be formed as a reflective electrode. The reflective electrode may include a reflective layer including Ag, Mg, Al, Pt, Pd, Au, Ni, Nd, Ir, Cr, or a compound thereof, and a transparent or translucent electrode layer formed on the reflective layer. When the light emitting element EL1 is a back light emitting element, the first electrode 116 may include a transparent material such as ITO, IZO, ZnO, or $In_2O_3$, and may be formed as a transparent or translucent electrode.

As shown in FIG. 9, each of the buffer film 11, the first insulating film 12, the second insulating film 13, and the third insulating film 14 may be provided to cover both the display region 100 and the transmission region 200. However, embodiments of the present disclosure are not limited thereto, and at least one of the buffer film 11, the first insulating film 12, the second insulating film 13, and the third insulating film 14 may be provided with an opening at a position corresponding to the transmission region 200, thereby further increasing the external light transmission efficiency of the transmission region 200.

The external light passes through the transmission region 200 and is recognized by a user. Therefore, only a transparent insulating film or the like may be disposed in the transmission region 200, and reflection occurring at the interface of the films disposed in the transmission region 200 may be minimized, thereby increasing the transmittance of the transmission region 200.

The interfacial reflection may increase as a difference in refractive index between the films in contact with each other increases. According to an embodiment, all of the buffer film 11, the first insulating film 12, the second insulating film 13, and the third insulating film 14 may be a single-layer film respectively having substantially the same refractive index. Since all of the buffer film 11, the first insulating film 12, the second insulating film 13, and the third insulating film 14, disposed in the transmission region 200, are formed to have the same refractive index, the interfacial reflection occurring between the films may be minimized, thereby increasing the transmittance of the transmission region 200.

Figure 10:
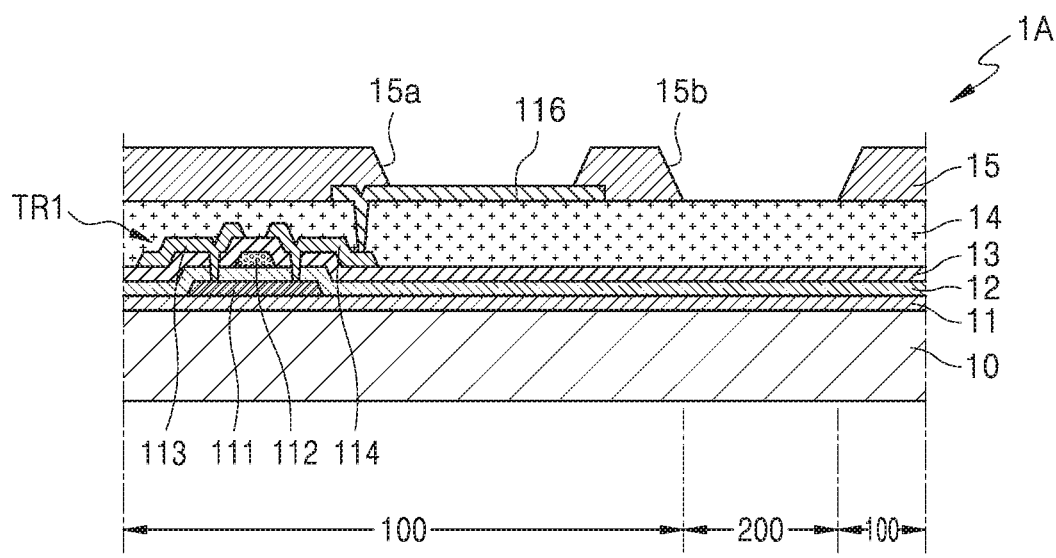

Referring to FIG. 10, a fourth insulating film 15 covering the edge of the first electrode 116 may be provided on the third insulating film 14. The fourth insulating film 15 may be the aforementioned inorganic insulating film or organic insulating film formed of a single layer or a plurality of layers.

The fourth insulating film 15 may be provided to cover the display region 100 of the display apparatus 1A. In this case, the fourth insulating film 15 is not necessarily provided to cover the entire display region 100, and is sufficient to cover at least a part of the display region 100, particularly, the edge of the first electrode 116 of the first pixel PX1.

The fourth insulating film 15 may include a first opening 15a exposing at least a part of the first electrode 116 of the first pixel PX1 and a second opening 15b at a position corresponding to the transmission region 200. Since the fourth insulating film 15 is not disposed in the transmission region 200, the external light transmission efficiency of the transmission region 200 may be further increased.

Figure 11:
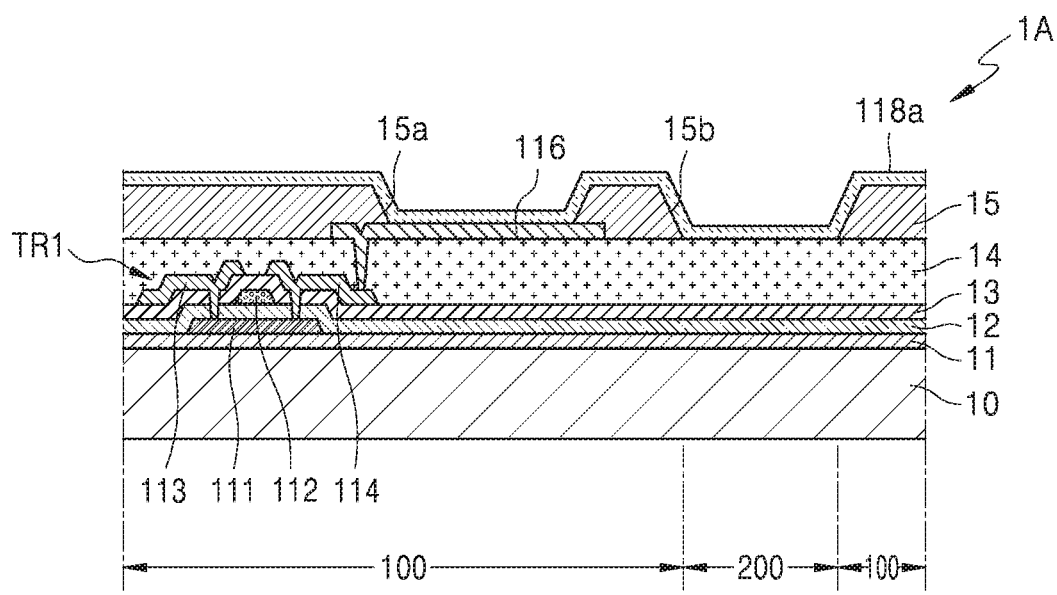

Referring to FIG. 11, a first layer 118a including a first material may be provided on the entire surface of the first substrate 10 (that is, the fourth insulating film 15, the first electrode 116 exposed through the first opening 15a of the first pixel PX1, and the third insulating film 14 exposed through the second opening 15b).

In an embodiment, the first material may be provided by depositing the first material on the entire surface of the first substrate 10 using a dry process, for example, an open mask.

In another embodiment, the first material may be applied onto the entire surface of the first substrate 10 using a wet process.

Figure 12:
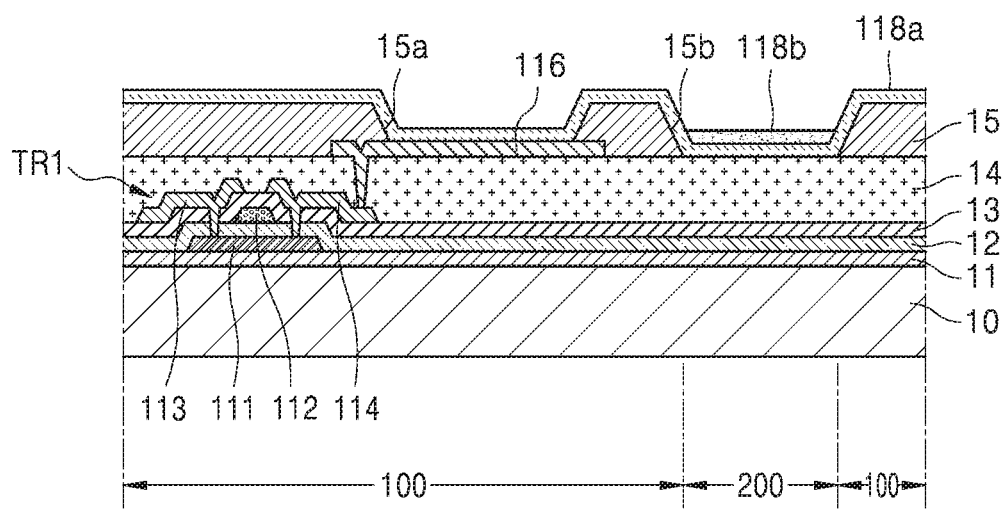

Referring to FIG. 12, a second layer 118b including a third material may be provided on the first layer 118a exposed through the second opening 15b.

In an embodiment, the third material may be provided only in the transmission region 200 using a mask, for example, a fine metal mask (FMM) having an opening M11 corresponding to the transmission region 200 of the display apparatus 1A. Specifically, the third material may be deposited using the FMM.

Figure 13:
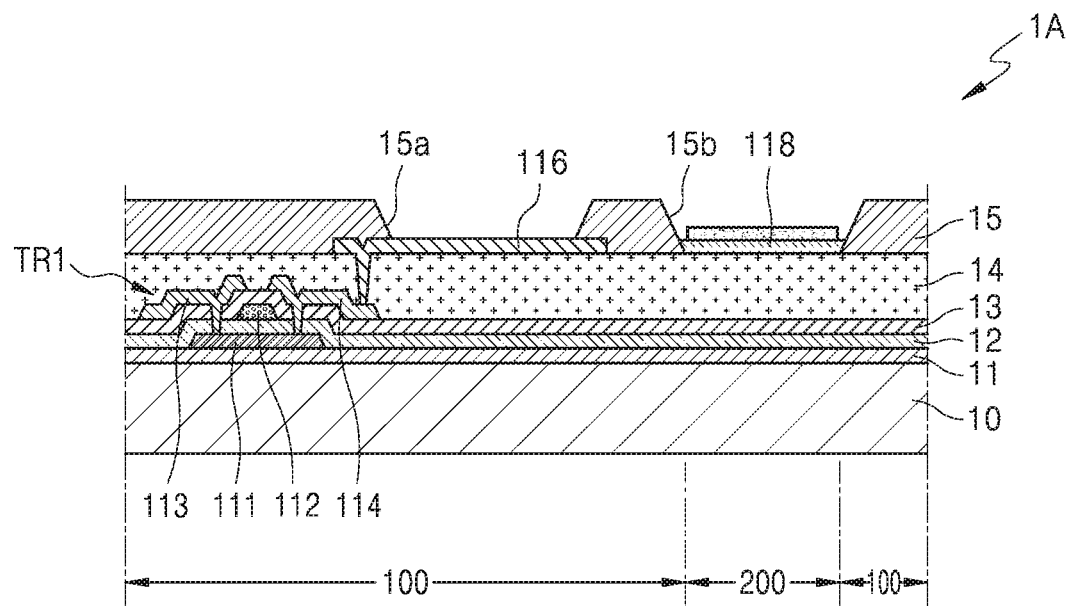

Referring to FIG. 13, an auxiliary layer 118 may be formed by removing the first layer 118a disposed to correspond to the display region 100.

In an embodiment, the first layer 118a may be removed by performing plasma treatment, for example, plasma heat treatment on the entire surface thereof. The auxiliary layer 118 is completed by removing the first layer 118a. Since the third material is deposited to correspond to the transmission region 200, the transmission region 200 remains in a state in which the first material and the third material are not removed, even when the plasma treatment is performed. During the process, the first material diffuses in a direction from the first layer to the second layer, and thus the interface between the first layer and the second layer disappears. Simultaneously, the concentration of the first material on one surface of the auxiliary layer 118, specifically, the concentration of the first material on a surface farther from the first substrate 10 increases. Accordingly, even when the second electrode is formed immediately without removing the second layer 118b, patterning by a difference in surface energy between the first material and the second material may be possible.

Figure 14:
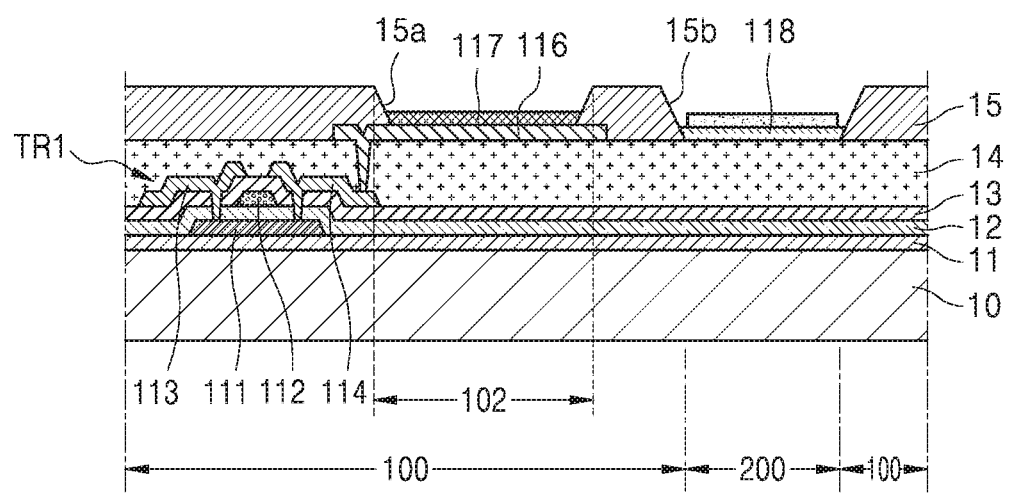

Referring to FIG. 14, an intermediate layer 117 may be provided on the first electrode 116 exposed through the first opening 15a of the first pixel PX1.

The intermediate layer 117 includes a light emitting layer for emitting light, and may further include at least one functional layer of a hole injection layer (HIL), a hole transport layer (HTL), an electron transport layer (ETL), and an electron injection layer (EIL). However, the present embodiment is not limited thereto, and various functional layers may be further provided on the first electrode 116.

The light emitting layer may be a red light emitting layer, a green light emitting layer, or a blue light emitting layer. The light emitting layer may have a multilayer structure in which a red light emitting layer, a green light emitting layer, and a blue light emitting layer are stacked to emit white light, or may have a single layer structure including a red light emitting material, a green light emitting material, and a blue light emitting material.

In an embodiment, the intermediate layer 117 may be provided only in the light emitting area 102 using a mask, for example, a fine metal mask (FMM) having an opening M21 corresponding to the light emitting area 102 of the display apparatus 1A.

In another embodiment, the light emitting layer of the intermediate layer 117 may be provided only in the light emitting area 102 using a mask, for example, a fine metal mask (FMM) having an opening M21 corresponding to the light emitting area 102 of the display apparatus 1A, and other functional layers may be provided on the entire surface of the first substrate 10.

In an embodiment of the present disclosure, at least, the light emitting layer is not provided in the transmission region 200 of the display apparatus 1A.

Figure 15:
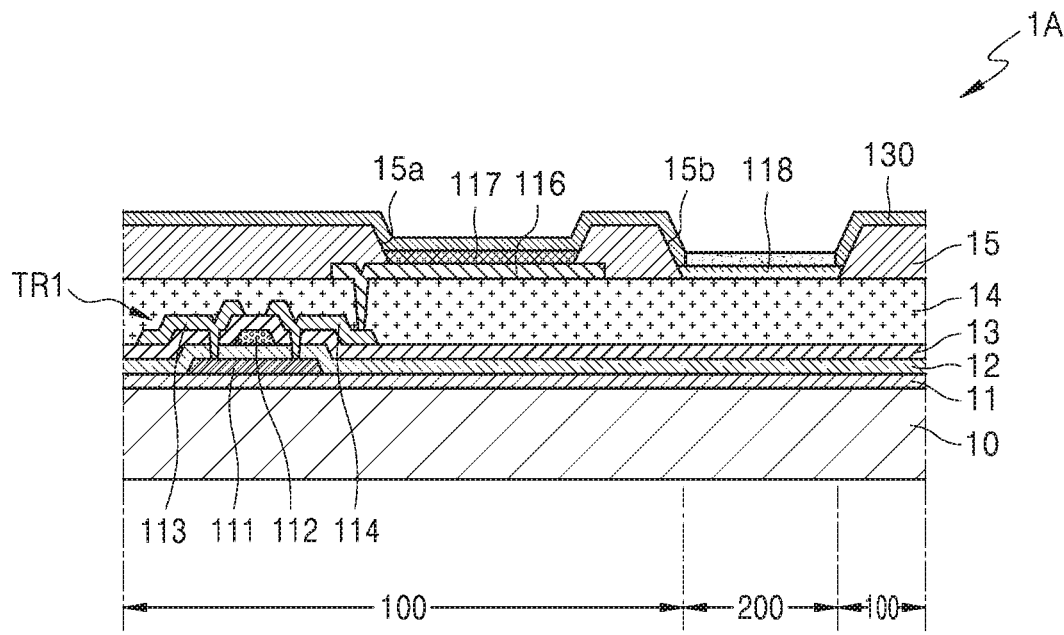

Referring to FIG. 15, in an embodiment, a second electrode 130 may be provided on the intermediate layer 117 or on the intermediate layer 117 and the auxiliary layer 118.

The second electrode 130 may be provided by depositing the second material using an open mask. In this case, the surface energy of the first material of the auxiliary layer 118 and the surface energy of the second material of the second electrode 130 are controlled to be different from each other, and thus the second material may not be substantially provided in the transmission region 200 provided with the first material. That is, the second material can be deposited on the intermediate layer 117, but cannot be deposited on the auxiliary layer 118 including the first material. Accordingly, since the auxiliary layer 118 including the first material is disposed to correspond to the transmission region 200, the second electrode 130 including the second material may be provided to correspond only to the display region 100 without being substantially provided in the transmission region 200.

Figure 16:
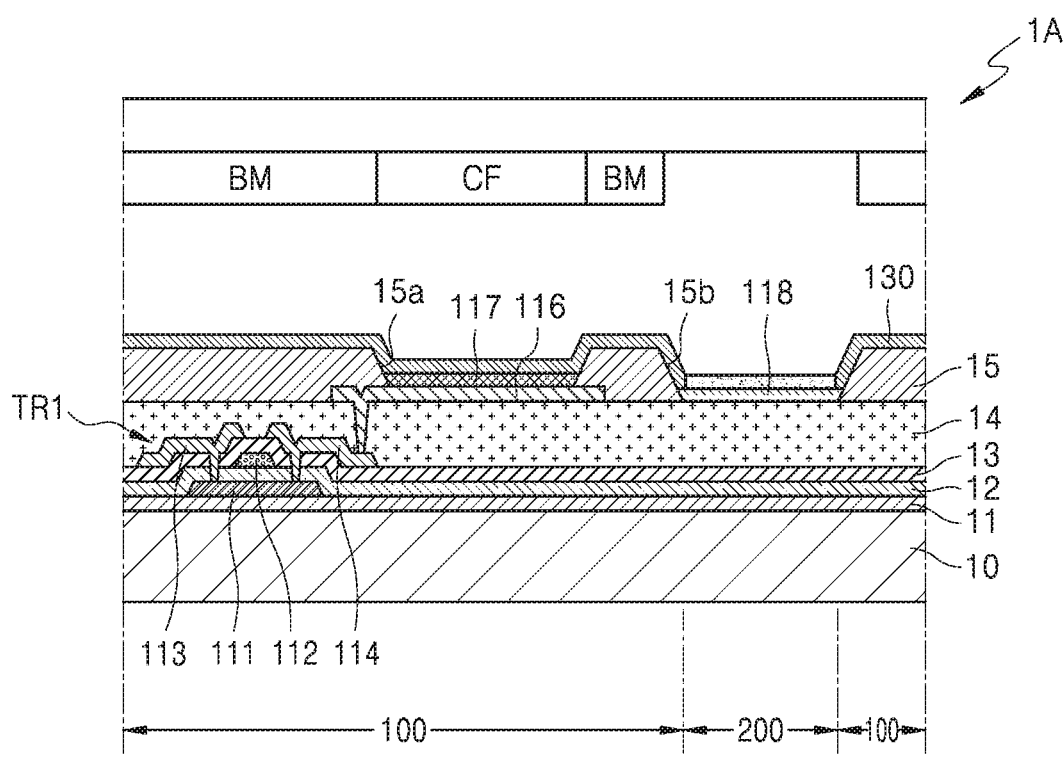

Referring to FIG. 16, after further aligning a second substrate 30 on the first substrate 10, the first substrate 10 and the second substrate 30 may be coupled to each other.

The second substrate 30 may include a glass material, a ceramic material, a metal material, a plastic material, or a material having flexible or bendable properties.

A black matrix BM and a color filter CF may be disposed on a surface of the second substrate 30, the surface facing the first substrate 10. The color filter CF may be disposed to correspond to the light emitting area 102 of the display apparatus 1A. The black matrix BM may be disposed to correspond to an area except for the light emitting area 102 and transmission region 200 of the display apparatus 1A. That is, the black matrix BM is not disposed in the transmission region 200 of the display apparatus 1A.

Although not shown, a protective layer may be further disposed on the second electrode 130 before coupling the second substrate 30 to the first substrate 10. The protective layer may be a single layer or a plurality of layers of an inorganic film and/or an organic film.

Furthermore, although not shown, various functional layers may be further provided on the second substrate 30. For example, the functional layer may be an anti-reflection layer that minimizes reflection on the upper surface of the second substrate 30, or an anti-fouling layer that prevents contamination, such as a user's hand prints (for example, fingerprint marks).

In another embodiment, instead of the second substrate 30 described above, a thin film encapsulation layer may be disposed on the first substrate 10. The thin film encapsulation layer may include at least one inorganic encapsulation layer including an inorganic material and at least one organic encapsulation layer including an organic material. In some embodiments, the thin film encapsulation layer may have a structure in which the first inorganic encapsulation layer, the organic encapsulation layer, and the second inorganic encapsulation layer are stacked.

After the auxiliary layer 118 is formed, as long as the second electrode 130 is formed, various modifications in the process are possible.

The display apparatus may be implemented as an electronic appliance 1000 such as a mobile phone, a video phone, smart phone, a smart pad, a smart watch, a tablet PC, a notebook, a computer monitor, a television, a digital broadcasting terminal, a personal digital assistant (PDA), a portable multimedia player (PMP), a head mounted display (HMD), or a vehicle navigator.

Figure 17:
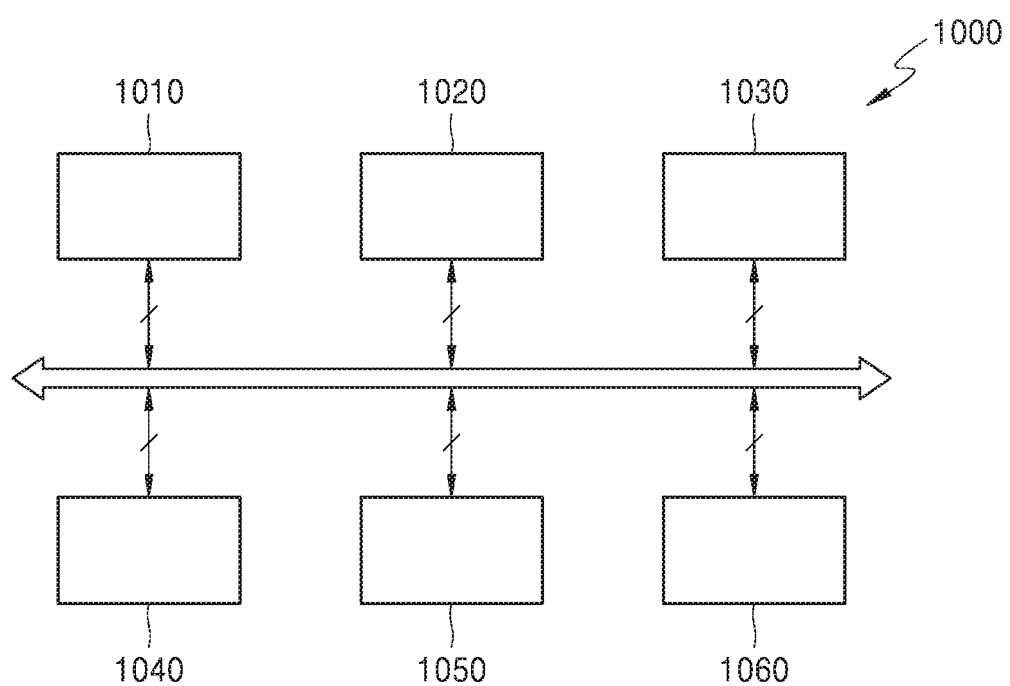
FIG. 17 is a block diagram schematically illustrating a configuration of an electronic appliance according to an embodiment of the present disclosure.
Figure 18A:
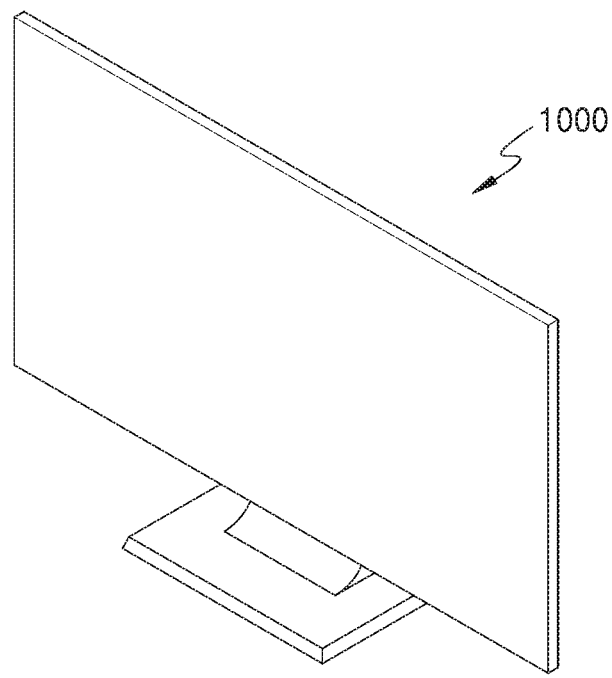
FIGS. 18A and 18B are perspective views schematically illustrating electronic appliances according to an embodiment of the present disclosure.
Figure 18B:
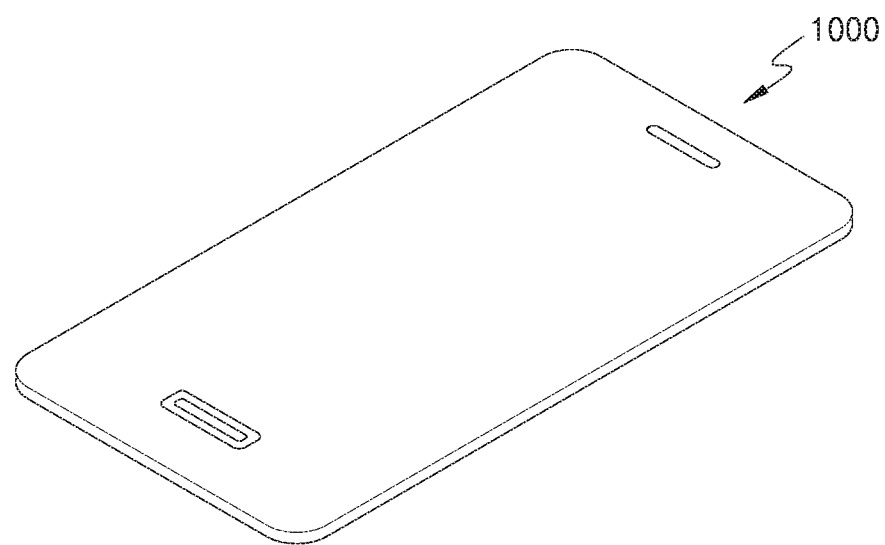

FIG. 17 is a block diagram schematically illustrating a configuration of an electronic appliance according to an embodiment of the present disclosure. FIGS. 18A and 18B are perspective views schematically illustrating electronic appliances according to an embodiment of the present disclosure.

Referring to FIG. 17, the electronic appliance 1000 may include a processor 1010, a memory device 1020, a storage device 1030, an input/output device 1040, a power supply 1050, and a display apparatus 1060. In this case, the display apparatus 1060 may correspond to the display apparatus 1 of FIG. 1. The electronic appliance 1000 may further include various ports capable of communicating with a video card, a sound card, a memory card, a USB device, or the like, or communicating with other systems.

In an embodiment, as shown in FIG. 18A, the electronic appliance 1000 may be implemented as a television. In an embodiment, as shown in FIG. 18B, the electronic appliance 1000 may be implemented as a smart phone. However, these appliances are exemplary, and the electronic appliance 1000 is not limited thereto.

Next, the formation of the second electrode 130 according to the presence or absence of the first layer 118*a* will be described with reference to FIG. 19.

The graph indicated by Comparative Example 1 is a transmittance graph of Sample 1. Sample 1 is a glass substrate having a thickness of 0.5 mm. The graph indicated by Comparative Example 2 is a transmittance graph of Sample 2. Sample 2 is a substrate on which a Ag—Mg thin film having a thickness of 9 nm was formed by depositing Ag—Mg (weight ratio=10:1) on the glass substrate having a thickness of 0.5 mm. The graph indicated by Example 1 is a transmittance graph of Sample 3. Sample 3 is a substrate prepared by forming a first layer including a first material and having a thickness of 10 nm on the glass substrate having a thickness of 0.5 mm and then depositing Ag—Mg on the first layer to a thickness of 9 nm. It means that the second electrode was not formed as closer to the transmittance graph of Comparative Example 1.

Figure 19:
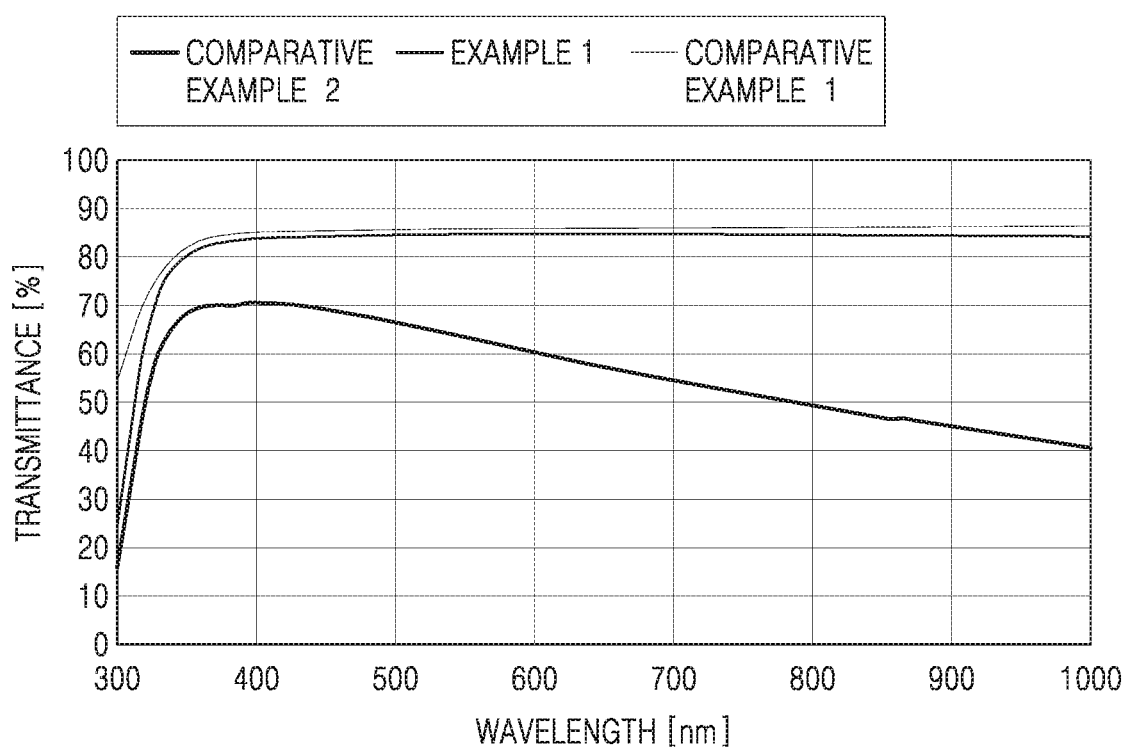
FIG. 19 is a graph showing transmittances with respect to wavelengths of Example 1 and Comparative Examples 1 and 2.

Referring to FIG. 19, it may be found that the graph of the Example 1 is remarkably closer to the graph of Comparative Example 1 than the graph of Comparative Example 2.

Accordingly, it may be found that the second electrode is not substantially formed by forming the auxiliary layer.

Next, the formation of the second electrode 130 with or without the second layer 118*b* will be described with reference to FIG. 20.

The graph indicated by Comparative Example 3 is a transmittance graph of Sample 4. Sample 4 is a substrate prepared by forming a second layer including a third material and having a thickness of 152 nm on the glass substrate having a thickness of 0.5 mm. The graph indicated by Comparative Example 4 is a transmittance graph of Sample 5. Sample 5 is a substrate prepared by forming a first layer including a first material and having a thickness of 10 nm on the glass substrate having a thickness of 0.5 mm and then forming a second layer including a third material and having a thickness of 152 nm on the first layer. The graph indicated by Example 2 is a transmittance graph of Sample 6. Sample 6 is a substrate in which an Ag—Mg thin film having a thickness of 9 nm is prepared by forming a first layer including a first material and having a thickness of 10 nm on the glass substrate having a thickness of 0.5 mm, forming a second layer including a third material and having a thickness of 152 nm on the first layer and then depositing Ag—Mg (weight ratio=10:1) on the second layer to a thickness of 9 nm. It means that the second electrode was not formed as closer to the transmittance graph of Comparative Example 4.

Figure 20:
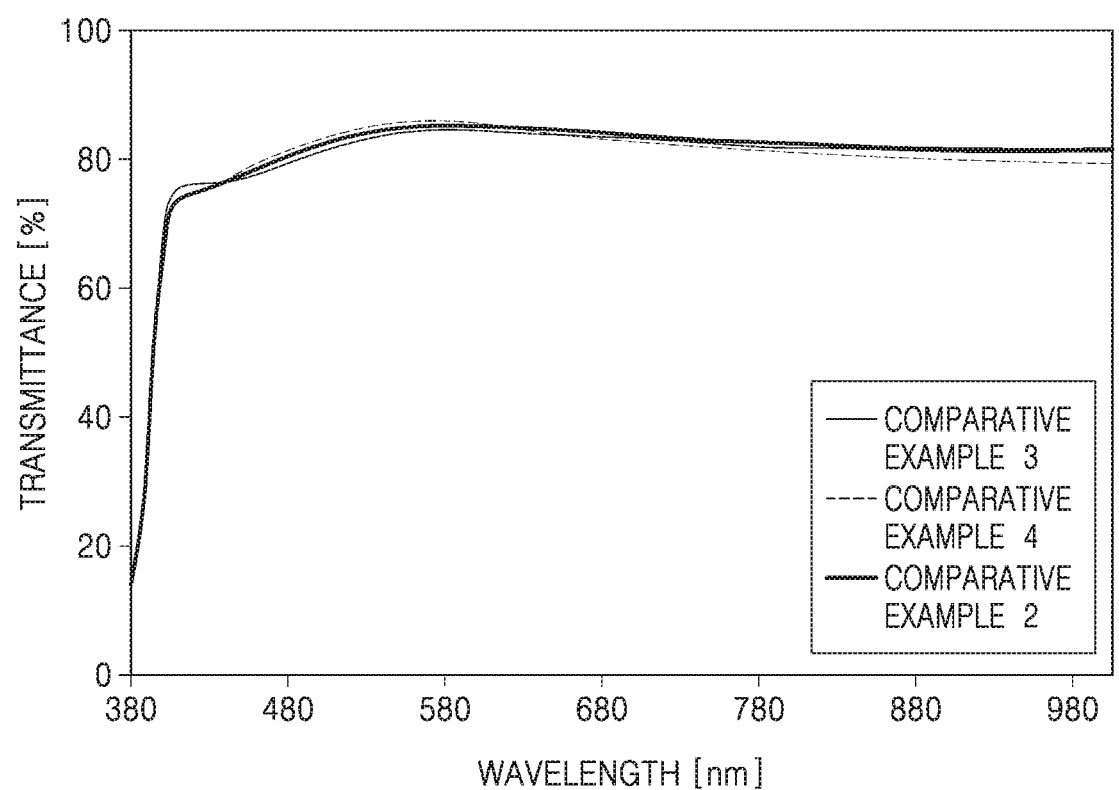
FIG. 20 is a graph showing transmittances with respect to wavelengths of Example 2 and Comparative Examples 3 and 4.

Referring to FIG. 20, it may be found that the graph of Example 2 is almost similar to the graph of Comparative Example 4. Accordingly, it may be found that the second electrode is not substantially formed on the auxiliary layer without a separate process of removing the second layer.

Next, the distribution of the first material in the auxiliary layer 118 will be described with reference to FIG. 21.

Figure 21:
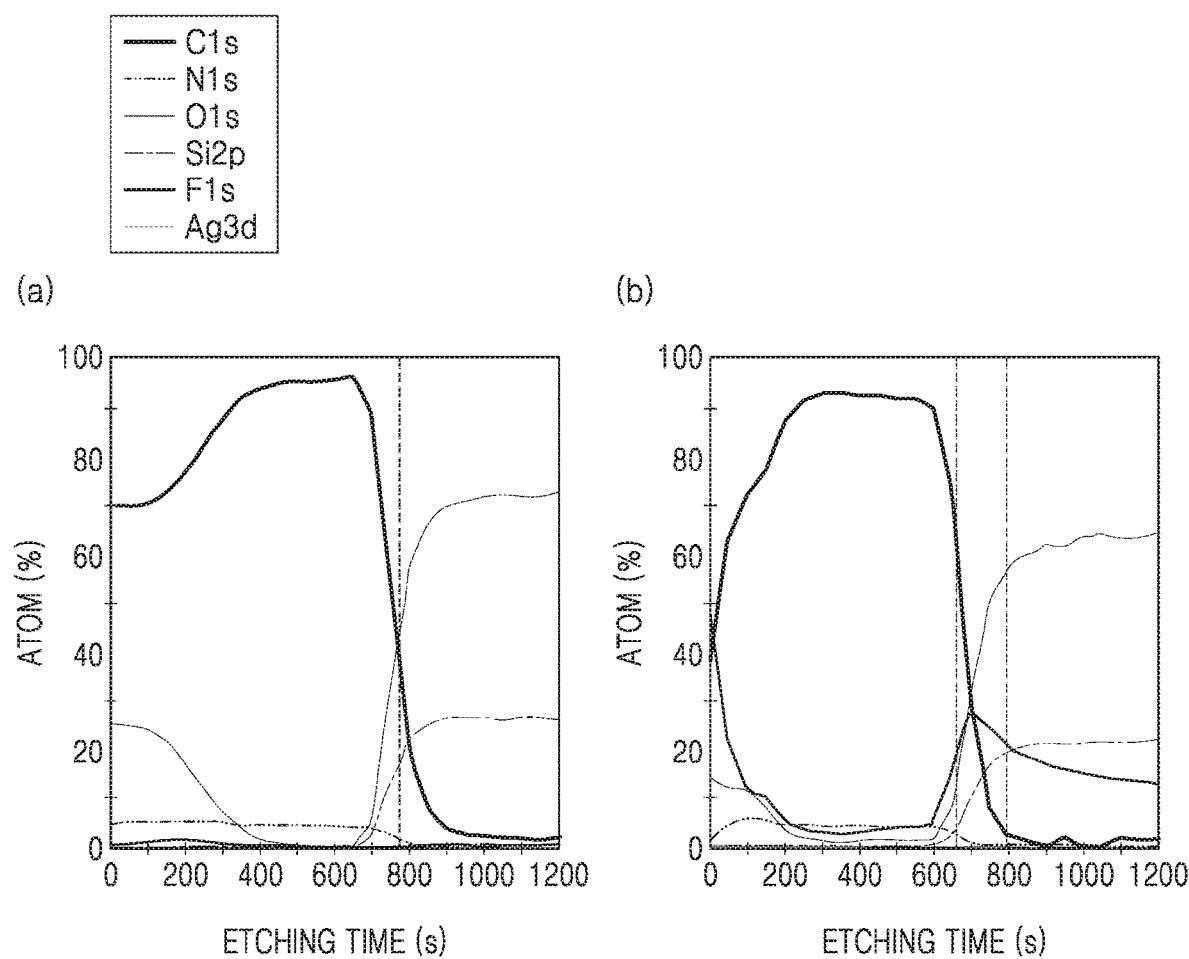
FIG. 21 is a diagram illustrating the elemental analysis results of Example 2 and Comparative Example 3 with respect to depth according to X-ray photoelectron analysis (XPS).

In FIG. 21, (a) shows the XPS result of Sample 4, and (b) shows the XPS result of Sample 6. Comparing (a) and (b), it may found that the concentration of fluorine is higher on one surface of the auxiliary layer 118, specifically, on one surface farther from the organic substrate. The fluorine originates from the first material. From (b), it may be expected that, although the first layer 119*a* is first formed on the glass substrate using the first material and then the second layer formed using the third material, the first material is diffused, and thus the concentration of the first material is increased on one surface of the auxiliary layer 118 further away from the glass substrate. Since the first material is present on the surface of the auxiliary layer 118 at a sufficiently high concentration, it may be found that the second electrode is patterned.

According to various embodiments of the present disclosure, since a common electrode is not substantially formed in a transmission region, a display apparatus having relatively high transmittance and a manufacturing method thereof may be provided.

However, the aforementioned effects are exemplary, and effects according to the embodiments will be described in detail with reference to the following contents.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display apparatus comprising:
a first substrate; and
a display unit,
wherein the display unit includes a display region and a transmission region,
the display unit comprises a first electrode, a second electrode facing the first electrode, and an intermediate layer between the first electrode and the second electrode in the display region,
the display unit comprises an auxiliary layer disposed to correspond to the transmission region, and
the first electrode and the second electrode disposed to correspond only to the display region,
the intermediate layer comprises a light emitting layer,
the auxiliary layer includes a first material and a third material,
the second electrode includes a second material,
the first material and the second material satisfy Equation 1 below,
the auxiliary layer includes a first region and a second region interposed between the first region and the first substrate, and
a concentration of the first material in the first region is different from a concentration of the first material in the second region:

$$ST2-ST1>0 \text{ mJ/m}^2 \qquad <\text{Equation 1}>$$

wherein in Equation 1,
ST1 is surface energy of the first material at 25° C., and
ST2 is surface energy of the second material at 25° C.

2. The display apparatus of claim 1, wherein the second electrode is not present in the transmission region.

3. The display apparatus of claim 1, wherein the first region includes a location having a maximum first material concentration.

4. The display apparatus of claim 1, wherein
the auxiliary layer further includes a third region,
the third region is interposed between the second region and the first substrate, and
a concentration of the first material in the second region is different from a concentration of the first material in the third region.

5. The display apparatus of claim 1, wherein ST1 is greater than about 0 mJ/m$^2$ and less than or equal to about 30 mJ/m$^2$.

6. The display apparatus of claim 1, wherein the first material has a molecular weight of about 1500 or less.

7. The display apparatus of claim 1, wherein the second material includes magnesium (Mg), silver (Ag), aluminum (Al), lithium (Li), calcium (Ca), indium (In), or a combination thereof.

8. The display apparatus of claim 1, wherein the third material has a molecular weight of about 1500 or less.

9. A display apparatus comprising:
a first substrate; and a display unit,
wherein the display unit includes a display region and a transmission region,
the display unit comprises a first electrode, a second electrode facing the first electrode, and an intermediate layer between the first electrode and the second electrode in the display region,
the display unit comprises an auxiliary layer disposed to correspond to the transmission region, and a second electrode disposed to correspond to the display region and the transmission region and having a first portion and a second portion, wherein the first portion has different thickness from the second portion, the intermediate layer comprises a light emitting layer, the auxiliary layer includes a first material and a third material, the second electrode includes a second material, the first material and the second material satisfy Equation 1 below, the auxiliary layer includes a first region and a second region interposed between the first region and the first substrate, and a concentration of the first material in the first region is different from a concentration of the first material in the second region:

$$ST2-ST1>0 \text{ mJ/m}^2 \qquad \text{<Equation 1>}$$

wherein in Equation 1,

ST1 is surface energy of the first material at 25° C., and

ST2 is surface energy of the second material at 25° C.

10. The display apparatus of claim 9, wherein the first portion of the second electrode is disposed to correspond to the display region, the second portion of the second electrode is disposed to correspond to the transmission region, and a thickness of the first portion is greater than a thickness of the second portion.

11. The display apparatus of claim 10, wherein the thickness of the second portion is greater than about 0 nm and about 1 nm or less.

12. The display apparatus of claim 9, wherein the first region includes a location having a maximum first material concentration.

13. The display apparatus of claim 9, wherein the auxiliary layer further includes a third region, the third region is interposed between the second region and the first substrate, and a concentration of the first material in the second region is different from a concentration of the first material in the third region.

14. The display apparatus of claim 9, wherein ST1 is greater than about 0 mJ/m$^2$ and less than or equal to about 30 mJ/m$^2$.

15. The display apparatus of claim 9, wherein the first material has a molecular weight of about 1500 or less.

16. The display apparatus of claim 9, wherein the second material includes magnesium (Mg), silver (Ag), aluminum (Al), lithium (Li), calcium (Ca), indium (In), or a combination thereof.

17. The display apparatus of claim 9, wherein the third material has a molecular weight of about 1500 or less.

* * * * *